US012542517B2

(12) United States Patent

Lakshmikumar et al.

(10) Patent No.: US 12,542,517 B2

(45) Date of Patent: Feb. 3, 2026

(54) BASELINE WANDER DIFFERENTIAL TIA WITH RESISTIVE FEEDFORWARD AC COUPLING PATH

(71) Applicant: Cisco Technology, Inc., San Jose, CA (US)

(72) Inventors: Kadaba Lakshmikumar, Hillsborough, NJ (US); Alexander Christopher Kurylak, Nazareth, PA (US); Romesh Kumar Nandwana, Chapel Hill, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 614 days.

(21) Appl. No.: 17/976,991

(22) Filed: Oct. 31, 2022

(65) Prior Publication Data

US 2024/0146252 A1 May 2, 2024

(51) Int. Cl.

*H03F 1/08* (2006.01)
*H03F 1/42* (2006.01)
(Continued)

(52) U.S. Cl.

CPC ............... *H03F 1/083* (2013.01); *H03F 1/42* (2013.01); *H03F 3/087* (2013.01);
(Continued)

(58) Field of Classification Search

CPC ................. H03F 1/083; H03F 3/45475; H03F 2203/45526; H03F 2203/45528;
(Continued)

(56) References Cited

U.S. PATENT DOCUMENTS 7,505,696 B2 3/2009 Day
8,471,639 B2 6/2013 Welch
(Continued)

FOREIGN PATENT DOCUMENTS

CA 2077089 C * 8/2001 ......... A61B 5/02154
CN 104049662 A * 9/2014 ............ H02M 3/156
(Continued)

OTHER PUBLICATIONS

Joris Lambrecht et al., "A 106-Gb/s PAM-4 Silicon Optical Receiver", IEEE Photonics Technology Letters, vol. 31, No. 7, Apr. 1, 2019, DOI: 10.1109/LPT.2019.2899147, IEEE, 4 pages.
(Continued)

*Primary Examiner* — Andrea Lindgren Baltzell
*Assistant Examiner* — Lance Torbjorn Bartol
(74) *Attorney, Agent, or Firm* — Edell, Shapiro & Finnan, LLC

(57) ABSTRACT

An apparatus comprises: a photodetector having a cathode and an anode to generate an output current; and a differential transimpedance amplifier (TIA) having a first amplifier input coupled to a first one of the cathode and the anode through a first AC coupling capacitor and a first feedforward resistor that is connected in parallel with the first AC coupling capacitor between the first one of the cathode and the anode and the first amplifier input, the differential TIA having a second amplifier input coupled to a second one of the cathode and the anode that is not the first one of the anode and the cathode, the differential TIA configured to convert the output current of the photodetector as presented at the first amplifier input and the second amplifier input to a differential output voltage.

20 Claims, 15 Drawing Sheets

(51) Int. Cl.
*H03F 3/08* (2006.01)
*H03F 3/45* (2006.01)

(52) U.S. Cl.
CPC ... *H03F 3/45475* (2013.01); *H03F 2200/135* (2013.01); *H03F 2203/211* (2013.01); *H03F 2203/45138* (2013.01); *H03F 2203/45526* (2013.01); *H03F 2203/45528* (2013.01)

(58) Field of Classification Search
CPC .. H03F 2203/45138; H03F 1/42; H03F 3/087; H03F 2200/135; H03F 2203/211
USPC .......................................................... 330/252
See application file for complete search history.

(56) References Cited

U.S. PATENT DOCUMENTS

| | | | |
|---|---|---|---|
| 8,907,729 | B2 | 12/2014 | Temporiti Milani et al. |
| 10,020,784 | B1 | 7/2018 | Christensen et al. |
| 10,171,051 | B2 * | 1/2019 | Oku ..................... H04B 10/693 |
| 10,250,207 | B2 | 4/2019 | Welch |
| 10,348,257 | B2 | 7/2019 | Welch |
| 10,505,509 | B2 * | 12/2019 | Lakshmikumar ......... H03F 1/30 |
| 12,068,788 | B2 * | 8/2024 | Kumagai ........... H04B 10/6931 |
| 2003/0219260 | A1 | 11/2003 | Chiou et al. |
| 2004/0130397 | A1 | 7/2004 | Mactaggart |
| 2008/0088354 | A1 | 4/2008 | Mosinskis |
| 2008/0240735 | A1 | 10/2008 | Bossard |
| 2010/0258729 | A1 * | 10/2010 | Roxburgh .............. G08C 23/04 250/340 |
| 2013/0336665 | A1 | 12/2013 | Suzuki |
| 2015/0295660 | A1 | 10/2015 | Suzuki |
| 2016/0226595 | A1 | 8/2016 | Duthel et al. |
| 2017/0086687 | A1 | 3/2017 | Imai |
| 2020/0091881 | A1 * | 3/2020 | Lim .................... H03F 3/45475 |
| 2020/0096711 | A1 | 3/2020 | Papanikolaou et al. |
| 2020/0110290 | A1 | 4/2020 | Nagaraju et al. |
| 2023/0092750 | A1 * | 3/2023 | Sugimoto ........... H03F 3/45475 330/252 |

FOREIGN PATENT DOCUMENTS

| | | | | |
|---|---|---|---|---|
| CN | 109039473 | A | | 12/2018 |
| CN | 113193840 | A | | 7/2021 |
| CN | 214472593 | U | * | 10/2021 |
| JP | 2016025513 | A | | 2/2016 |

OTHER PUBLICATIONS

Joris Lambrecht et al., "56-Gb/s Silicon Optical Receiver using a Low-Noise Fully-Differential Transimpedance Amplifier in SiGe BiCMOS", 2018 European Conference on Optical Communication (ECOC), Sep. 23-27, 2018, DOI: 10.1109/ECOC.2018.8535469, IEEE, 3 pages.
Bahram Zand et al., "Transimpedance Amplifier With Differential Photodiode Current Sensing", 1999 IEEE International Symposium on Circuits and Systems (ISCAS), May 30-Jun. 2, 1999, DOI: 10.1109/ISCAS.1999.780842, IEEE, 4 pages.
Semjon Schaefer, et al., "Coherent receiver design based on digital signal processing in optical high-speed intersatellite links with M-phase-shift keying," Optical Engineering, SPIE, vol. 55, Nov. 2016, 13 pages.
Mostafa G. Ahmed, et al., "34-GBd Linear Transimpedance Amplifier for 200-Gb/s DP-16-QAM Optical Coherent Receivers," IEEE Journal of Solid-State Circuits, vol. 54, No. 3, Mar. 2019, 11 pages.
Joris Lambrecht, et al., "90-Gb/s NRZ Optical Receiver in Silicon Using a Fully Differential Transimpedance Amplifier," IEEE, Journal of Lightwave Technology, vol. 37, No. 9, May 1, 2019, 10 pages.
Sourav Gupta, "Transimpedance Amplifier—Current to Voltage Converter," Circuit Digest, https://circuitdigest.com/tutorial/transimpedance-amplifier-design-working-and-applications, Jul. 10, 2019, 13 pages.

* cited by examiner

BASELINE WANDER DIFFERENTIAL TIA WITH RESISTIVE FEEDFORWARD AC COUPLING PATH

TECHNICAL FIELD

The present disclosure relates to differential transimpedance amplifiers (TIAs).

BACKGROUND

A differential transimpedance amplifier (TIA) is a circuit block for optical receivers to convert optical signal/current into voltage for data processing. While a differential TIA improves signal-to-noise ratio (SNR), it introduces baseline wander due to a low frequency cut-off corner added by an alternating current (AC) coupling capacitor on a cathode or both the cathode and an anode of a photodiode at an input to the TIA. The capacitance of the AC coupling capacitor can be increased to reduce the cut-off frequency but a large capacitance introduces additional parasitic capacitances, which reduce a bandwidth of the TIA.

DETAILED DESCRIPTION

Overview

Figure 1:
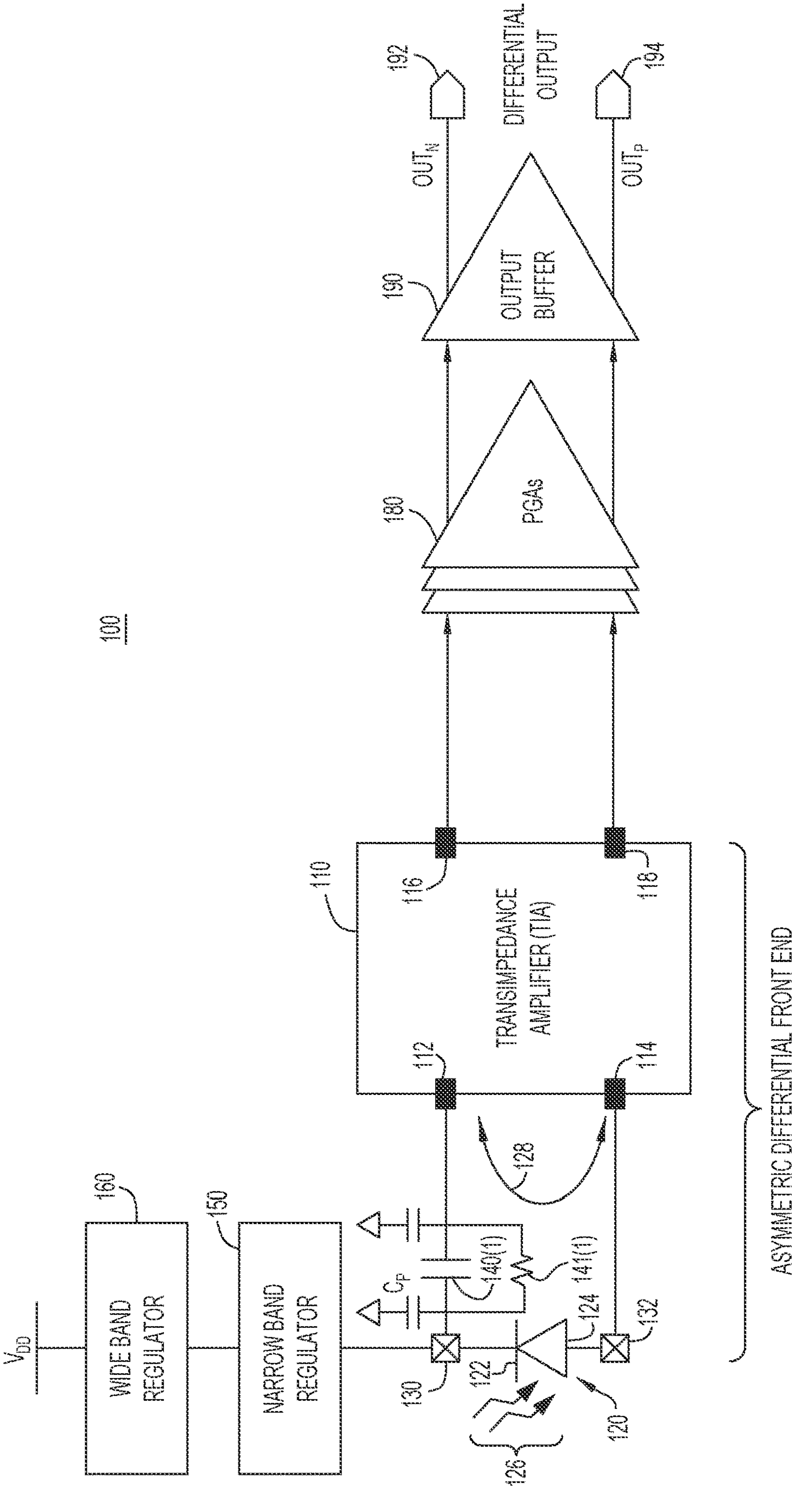
FIG. 1 is a circuit diagram of an asymmetric differential transimpedance amplifier (TIA) circuit having a single resistive feedforward AC coupling path, according to an example embodiment.

In an embodiment, an apparatus comprises: a photodetector having a cathode and an anode to generate an output current; and a differential transimpedance amplifier (TIA) having a first amplifier input coupled to a first one of the cathode and the anode through a first AC coupling capacitor and a first feedforward resistor that is connected in parallel with the first AC coupling capacitor between the first one of the cathode and the anode and the first amplifier input, the differential TIA having a second amplifier input coupled to a second one of the cathode and the anode that is not the first one of the anode and the cathode, the differential TIA configured to convert the output current of the photodetector as presented at the first amplifier input and the second amplifier input to a differential output voltage.

In another embodiment, an apparatus comprises: first and second differential front-ends to produce first and second differential output voltages, respectively, wherein the first and second differential front-ends each respectively includes: a photodetector having a cathode and an anode to generate an output current; and a differential transimpedance amplifier (TIA) having a first amplifier input coupled to a first one of the cathode and the anode through a first AC coupling capacitor and a first feedforward resistor connected in parallel with the first AC coupling capacitor, the differential TIA having a second amplifier input coupled to a second one of the cathode and the anode that is not the first one of the cathode and the anode, the differential TIA configured to convert the output current of the photodetector as presented at the first amplifier input and the second amplifier input to a respective one of the first and second differential output voltages; and a differential-differencing programmable gain amplifier to perform a differencing operation on the first and second differential output voltages to produce a combined differential-differencing voltage.

Example Embodiments

Embodiments presented herein provide a high-impedance resistive path across or in parallel with an AC coupling capacitor on an input to a differential TIA. That is, the embodiments provide a resistive-AC coupled input to the differential TIA. Compared to conventional structures, the resistive-AC coupled input lowers baseline wander (i.e., reduces low-frequency intersymbol interference (ISI)) and also reduces the capacitance of the AC coupling capacitor for a given baseline wander, which results in a higher bandwidth due to reduced parasitic capacitance from the AC coupling capacitor. The high-impedance resistive path adds a negligible power penalty, and helps reduce a voltage swing at an output node of a regulator that supplies power to the differential TIA, which improves performance of the regulator in a mid-frequency range. The embodiments extend the range of a communication link for a given system power, and decrease transmitter power over the link for a given range.

The following circuit or structure embodiments are presented below along with related methods:

1. An asymmetric differential TIA circuit with a resistive feedforward resistor (FIG. 1).
2. An asymmetric differential TIA circuit with the resistive feedforward resistor and feedback cancellation (FIG. 4).
3. A symmetric differential TIA circuit with resistive feedforward resistors (FIG. 7).
4. An asymmetric differential-differencing TIA circuit with resistive feedforward resistors (FIG. 9).
5. A symmetric differential-differencing TIA circuit with resistive feedforward resistors (FIG. 10).

Referring to FIG. 1, there is a circuit diagram of an example asymmetric differential TIA circuit 100 that includes a single resistive feedforward AC coupling path. Asymmetric differential TIA circuit 100 represents an amplification system or apparatus that may be used as part of an optical receiver to amplify an electrical signal obtained at the output of a device, such as an output of a photodetector (e.g., a photodiode). Asymmetric differential TIA circuit 100 may be referred to as apparatus 100 in the ensuing description.

Figure 2A:
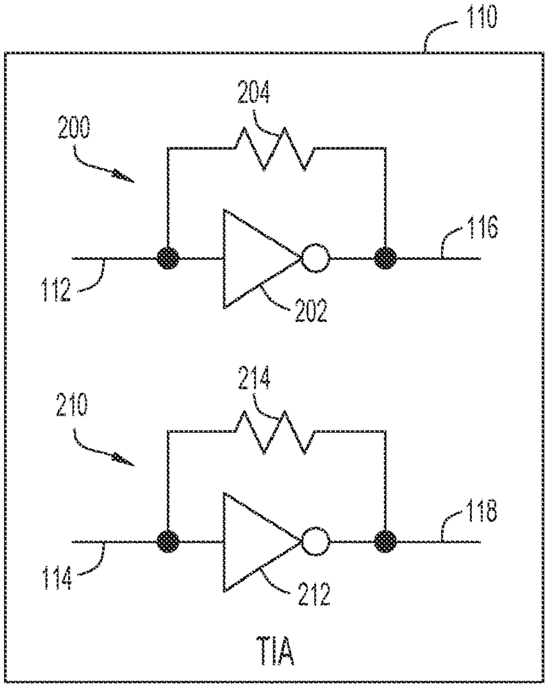
FIG. 2A shows one form of a differential TIA introduced in FIG. 1, according to an example embodiment.
Figure 2B:
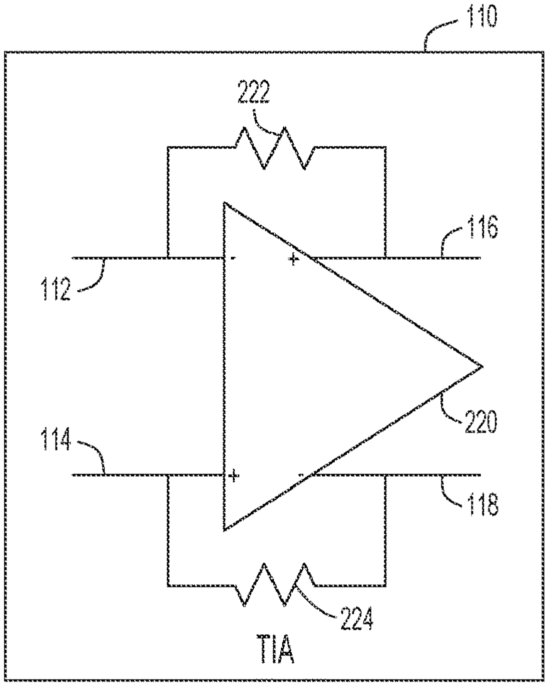
FIG. 2B shows another form of the differential TIA, according to an example embodiment.

Apparatus 100 includes a differential TIA 110 coupled to a photodetector or PD 120 that has a cathode 122 and anode 124. PD 120 detects an optical signal or light 126 and generates as output a differential electrical current signal or PD current 128 at cathode 122 and anode 124. Differential TIA 110 has differential amplifier inputs comprising a first amplifier input 112 and a second amplifier input 114, and differential outputs comprising a first output 116 and a second output 118. Further, differential TIA 110 can be realized with two identical single ended TIAs as shown in FIG. 2A or by a fully differential topology as shown in FIG. 2B, described below.

Apparatus 100 further includes a first input 130 coupled to cathode 122 of PD 120, and a second input 132 coupled to anode 124 of PD 120. Thus, first input 130 and second input 132 may also be equivalently referred to as cathode 122 and anode 124. An AC coupling capacitor 140(1) (also referred to as a DC blocking capacitor) has a first end connected to first input 130. A high impedance feedforward resistor 141(1) has a first end also connected to first input 130. First amplifier input 112 of differential TIA 110 is connected to a second end of AC coupling capacitor 140(1) and a second end of feedforward resistor 141(1) so that the AC coupling capacitor and the feedforward resistor are connected in parallel with each other between the first input and the first amplifier input. That is, respective first ends of AC coupling capacitor 140(1) and feedforward resistor 141(1) are connected to first input 130 (i.e., cathode 122) and respective second ends of the AC coupling capacitor and the feedforward resistor are connected to first amplifier input 112. FIG. 1 shows parasitic capacitances $C_P$ associated with AC coupling capacitor 140(1).

Thus, first input 130 (i.e., cathode 122) is indirectly coupled to first amplifier input 112 through a first path that includes AC coupling capacitor 140(1) connected in parallel with feedforward resistor 141(1). On the other hand, second amplifier input 114 of differential TIA is directly connected to second input 132 (i.e., anode 124). That is, second input 132 is connected to second amplifier input 114 through a second path that is a direct connection. Thus, the first path and the second path are asymmetric.

PD current 128 flows through first and second inputs 130, 132 (i.e., cathode 122, anode 124). First input 130 (i.e., cathode 122) delivers PD current 128 to first amplifier input 112 through the parallel circuit comprising AC coupling capacitor 140(1) and feedforward resistor 141(1). Feedforward resistor 141(1) provides a low impedance parallel path for PD current 128 from first input 130 (i.e., cathode 122) to first amplifier input 112 at low- to mid-range frequencies of the PD current, thereby reducing a low frequency ISI corner, as described herein. The low impedance parallel path at the low- to mid-range frequencies also allows a reduction in the capacitance of AC coupling capacitor 140(1), which results in a higher overall bandwidth for apparatus 100. Second input 132 (i.e., anode 124) delivers PD current 128 to second amplifier input 114, directly. Differential TIA 110 is configured to convert PD current 128 obtained at first amplifier input 112 and second amplifier input 114 (i.e., as delivered to the first and second amplifier inputs by the first and second paths) to a differential output voltage at first and second outputs 116 and 118. That is, differential TIA 110 performs a transimpedance operation on PD current 128 to produce the differential output voltage.

A narrow band regulator 150 may be coupled to first input 130. Narrow band regulator 150 has a frequency-dependent impedance that increases with frequency so as to cause more of PD current 128 to flow into differential TIA with increasing frequency of PD current 128. The addition of feedforward resistor 141(1) reduces an effective voltage swing at first input 130 (i.e., at cathode 122), which helps maintain narrow band regulator 150 in its linear operating region. In addition, apparatus 100 may further include a wide band regulator 160 configured to be coupled between narrow band regulator 150 and a power or voltage supply ($V_{DD}$). Wide band regulator 160 suppresses noise of voltage supply $V_{DD}$. Further details of narrow band regulator 150 and wide band regulator 160 are provided below in the description of FIG. 3.

Apparatus 100 may further include at least one differential programmable gain amplifier (PGA) 180 coupled to first and second outputs 116, 118 of differential TIA 110. Differential PGA 180 amplifies the differential output voltage to generate differential programmable gain outputs. As shown in FIG. 1, there may be multiple instances of differential PGA 180 (connected in series).

Further, apparatus 100 may include an output buffer 190 coupled to the differential programmable gain outputs of the at least one differential PGA 180. Output buffer 190 buffers the differential programmable gain outputs to provide a buffered differential output voltage at first and second differential outputs 192 and 194, respectively, and also labeled $OUT_N$ and $OUT_P$, respectively.

Reference is now made to FIGS. 2A and 2B for a description of possible forms of differential TIA 110. FIG. 2A shows one form of the differential TIA, called a pseudo-differential amplifier that includes first and second branches 200 and 210, respectively, each including a single-ended amplifier and a feedback resistor. Specifically, first branch 200 includes an amplifier 202 and a feedback resistor 204 coupled from first output 116 to first amplifier input 112. Similarly, second branch 210 includes an amplifier 212 and a feedback resistor 214 coupled from second output 118 to second amplifier input 114. Thus, the TIA shown in FIG. 2A is a pseudo-differential TIA that includes a first single-ended amplifier and a second single-ended amplifier.

FIG. 2B shows another form of differential TIA 110, called a fully-differential amplifier. A fully-differential TIA amplifier has a single amplifier 220 having two inputs corresponding to first and second amplifier inputs 112 and 114, and two outputs corresponding to first and second outputs 116 and 118. There is a feedback resistor 222 coupled between first output 116 and first amplifier input 112, and a feedback resistor 224 coupled between second output 118 and second amplifier input 114.

Figure 3:
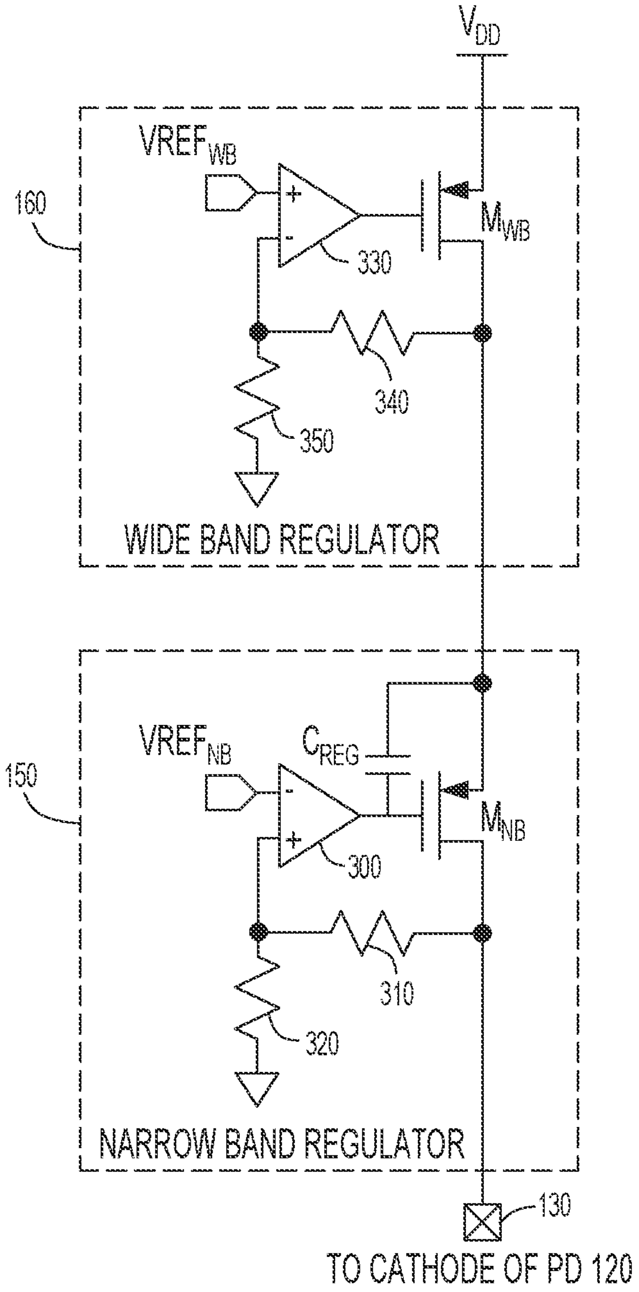
FIG. 3 is a circuit diagram of a narrow band regulator and a wide band regulator of FIG. 1, according to an example embodiment.

Turning now to FIG. 3, with continued reference to FIG. 1, example schematic diagrams are shown of narrow band regulator 150 and wide band regulator 160. Narrow band regulator 150 and wide band regulator 160 are connected in a cascaded manner where wide band regulator 160 precedes narrow band regulator 150 with respect to power supply $V_{DD}$.

Narrow band regulator 150 provides the DC-bias voltage for cathode 122 of PD 120, as generally shown in FIG. 1. Narrow band regulator 150 includes an operational amplifier 300 and a P-channel Metal Oxide Silicon (PMOS) pass transistor $M_{NB}$ to bias cathode 122 of PD 120. The pass transistor $M_{NB}$ includes a drain coupled to the cathode of PD 120, a gate and a source. Operational amplifier 300 has a negative (−) input, a positive (+) input and an output. Output of operational amplifier 300 is coupled to the gate of the pass transistor $M_{NB}$. A feedback resistor 310 (also referred to as $R_{310}$) is connected between the drain of the pass transistor $M_{NB}$ and the positive input of operational amplifier 300. A second resistor 320 (also referred to as $R_{320}$) is connected between the positive input of operational amplifier 300 and ground. The negative input of operational amplifier 300 is coupled to a voltage reference $VREF_{NB}$ representing a reference to a narrow band (NB) regulator. The voltage generated at cathode 122 will be $(1+R_{310}/R_{320})*VREF_{NB}$. The gate of pass transistor $M_{NB}$ is connected to the source via capacitor $C_{REG}$. This capacitor $C_{REG}$ ensures that above a certain frequency, the gate of the pass transistor $M_{NB}$ is shorted with the source of the pass transistor $M_{NB}$. This shorting allows a high output impedance at the drain node of the pass transistor $M_{NB}$, forcing more of the PD output current to go into the differential TIA amplifier, at higher frequencies of the PD output current.

By systematically designing for low bandwidth, narrow band regulator 150 provides low impedance in a lower frequency range (few hundreds of Hz to few hundreds of kHz) ensuring a DC bias of PD 120, while at the same time providing a frequency dependent higher impedance in a higher frequency range. This higher impedance ensures that the PD output current (desired signal) sees a high impedance into narrow band regulator 150, thus forcing more (perhaps all) of the PD output current through AC coupling capacitor 140(1), which is a relatively low impedance capacitor, to signal path of differential TIA 110. In addition, the PD current will flow through feedforward resistor 141(1), especially at lower frequencies when AC coupling capacitor 140(1) presents a higher impedance. This enables differential TIA to see a maximum amount of the PD output current over a wide range of signal frequencies. In an ideal case, it is desired to minimize the bandwidth of narrow band regulator 150 to ensure maximum frequency coverage by the differential TIA signal paths.

The wide band regulator 160 has a similar structure as narrow band regulator 150. Wide band regulator 160 includes an operational amplifier 330 and a PMOS pass transistor $M_{WB}$ to supply current to source of pass transistor $M_{NB}$ of narrow band regulator 150. The pass transistor $M_{WB}$ includes a drain coupled to source of pass transistor $M_{NB}$ of narrow band regulator 150, a gate and a source. The source of pass transistor $M_{WB}$ is connected to power or voltage supply $V_{DD}$. Operational amplifier 330 has a negative (−) input, a positive (+) input and an output. Output of operational amplifier 330 is coupled to gate of pass transistor $M_{WB}$. A feedback resistor 340 (also referred to as $R_{340}$) is connected between drain of pass transistor $M_{WB}$ and positive input of operational amplifier 330. A second resistor 350 (also referred to as $R_{350}$) is connected between positive input of operational amplifier 330 and ground. The negative input of operational amplifier 330 is coupled to a voltage reference $VREF_{WB}$ representing a wide band (WB) reference. The voltage generated at source of narrow band pass transistor $M_{NB}$ will be $(1+R_{340}/R_{350})*VREF_{WB}$.

The wide band regulator 160 precedes narrow band regulator 150, with respect to power supply $V_{DD}$, and provides noise rejection to power supply $V_{DD}$, with a wide bandwidth (a few tens of MHz to hundreds of MHz), as relatively narrow bandwidth of narrow band regulator 150 prohibits it from performing noise rejection on its own. That is, wide band regulator 160 is configured to suppress noise of voltage supply $V_{DD}$ over a wide range of frequencies. With use of wide band regulator 160 together with a narrow band regulator 150, impedance requirements and power supply noise rejection trade-off can be alleviated, providing independent controls for impedance bandwidth control and power supply rejection bandwidth.

Figure 4:
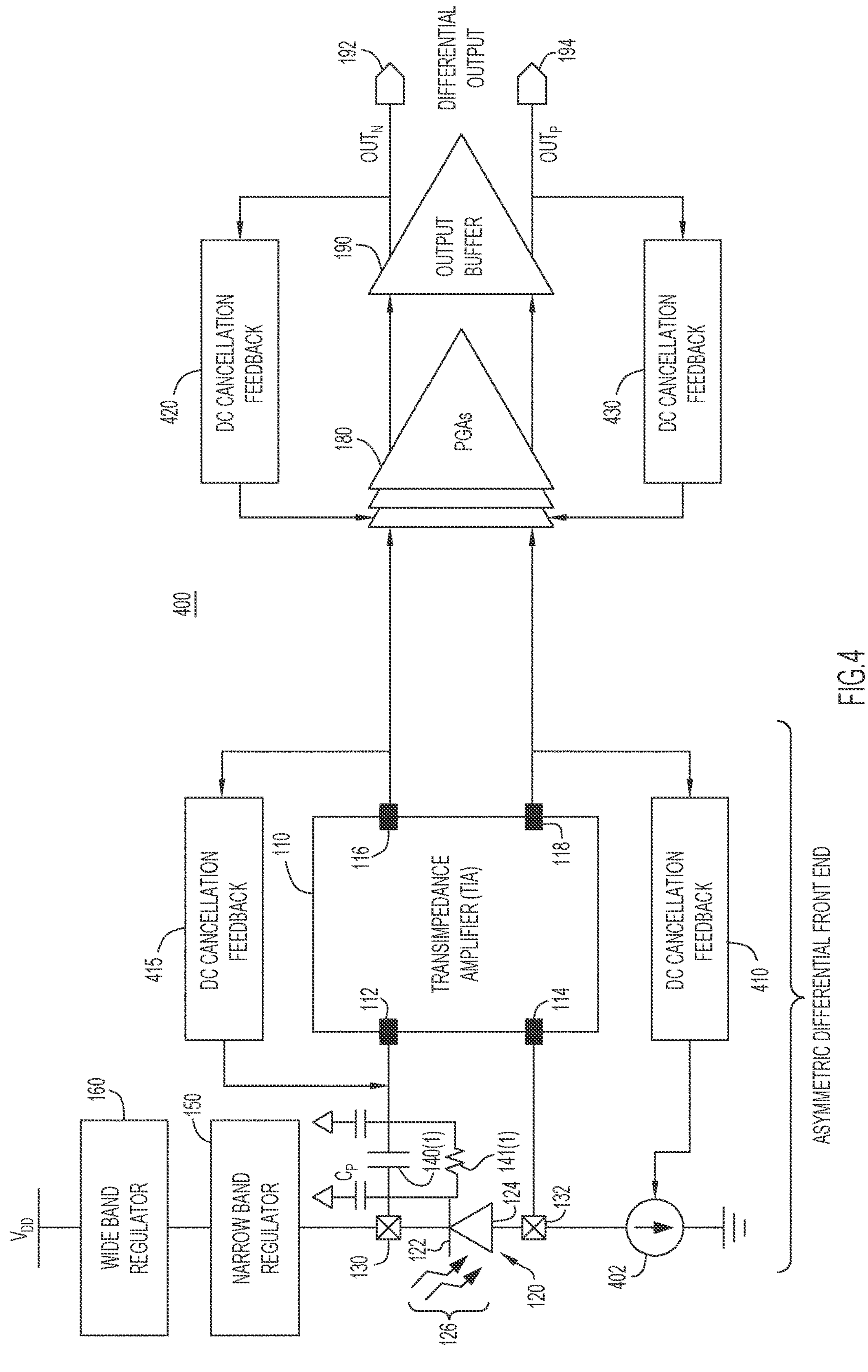
FIG. 4 shows a symmetric differential TIA circuit that includes the single resistive feedforward AC coupling path and also includes DC cancellation feedback, according to an example embodiment.

FIG. 4 is a circuit diagram of an example asymmetric differential TIA circuit 400 that includes a single resistive feedforward AC coupling path and DC cancellation. Asymmetric differential TIA circuit 400 is also referred to as apparatus 400. Apparatus 400 is the same as apparatus 100, except for the addition of the DC cancellation to various signal paths of the apparatus 100. The DC cancellation involves removing average values of DC currents in apparatus 400. A current source 402 is coupled to anode 124 of PD 120. Current source 402 removes DC current from anode 124. ADC cancellation feedback circuit 410 is coupled between second output 118 of differential TIA 110 and current source 402 or second amplifier input 114 to cancel DC current at anode 124. As used herein, the terms "DC feedback circuit" and "DC feedback loop" are synonymous. DC cancellation feedback circuit 410 provides a DC current cancelling control to current source 402 to control removal of DC current from anode 124. Another DC cancellation feedback circuit 415 is coupled between first output 116 of differential TIA 110 and first amplifier input 112 of differential TIA 110, to control removal of DC current produced by cathode 122 of PD 120.

In addition, there may be a DC cancellation feedback circuit coupled between differential outputs 192 and/or 194 and at least one differential PGA 180. For example, a DC cancellation feedback circuit 420 may be provided for a negative signal path between differential output 192 and at least one differential PGA 180, and a DC cancellation feedback circuit 430 may be provided for a positive signal path between differential output 194 and at least one differential PGA 180. Thus, DC cancellation feedback circuits 420 and 430 provide DC cancellation control to at least one differential PGA 180 to remove DC in one or both of the differential signal paths of at least one differential PGA 180. DC cancellation feedback circuits 420 and 430 can also be used to minimize an impact of the random and systematic mismatch of stages of PGAs and output buffer 190 to further improve the dynamic range performance of apparatus 400.

Referring to FIGS. 1 and 4, components 112-160 of apparatus 100 are collectively referred to as an asymmetric differential front-end of apparatus 100, and components 112-160 and 402-415 of apparatus 400 are collectively referred to as an asymmetric differential front-end of apparatus 400. For each apparatus, the asymmetric differential front-end (which may also be referred to as the asymmetric differential TIA front-end) converts PD current 128 generated at first input 130 and second input 132 to a differential output voltage across first output 116 and second output 118 of differential TIA 110.

An alternative embodiment to those described above switches the parallel circuit combination of AC coupling capacitor 140(1) and feedforward resistor 141(1) from the first path to the second path. Specifically, on the first path, cathode 122 is directly coupled to first amplifier input 112. On the second path, AC coupling capacitor 140(1) and feedforward resistor 141(1) are connected in parallel with each other to and between anode 124 (instead of cathode 122) and second amplifier input 114. That is, respective first ends of AC coupling capacitor 140(1) and feedforward resistor 141(1) are connected to anode 124 and respective second ends of the AC coupling capacitor and the feedforward resistor are connected to second amplifier input 114.

In summary, PD 120 has cathode 122 and anode 124 that generate output current responsive to light 126. Differential TIA 110 has amplifier inputs 112, 114. A first one of amplifier inputs 112, 114 is coupled to a first one of cathode 122 and anode 124 (i.e., to either the cathode or the anode) through AC coupling capacitor 140(1). In addition, feedforward resistor 141(1) is connected in parallel with AC coupling capacitor 140(1) between the first one of cathode 122 and anode 124 and the first one of amplifier inputs 112, 114. A second one of amplifier inputs 112, 114 that is not the first one of the amplifier inputs is coupled to a second one of cathode 122 and anode 124 that is not the first one of the cathode and the anode. In one arrangement, the first and second ones of cathode 122 and anode 124 are the cathode and the anode, respectively. In another arrangement, the first and second ones of cathode 122 and anode 124 are the anode and the cathode, respectively.

Figure 5:
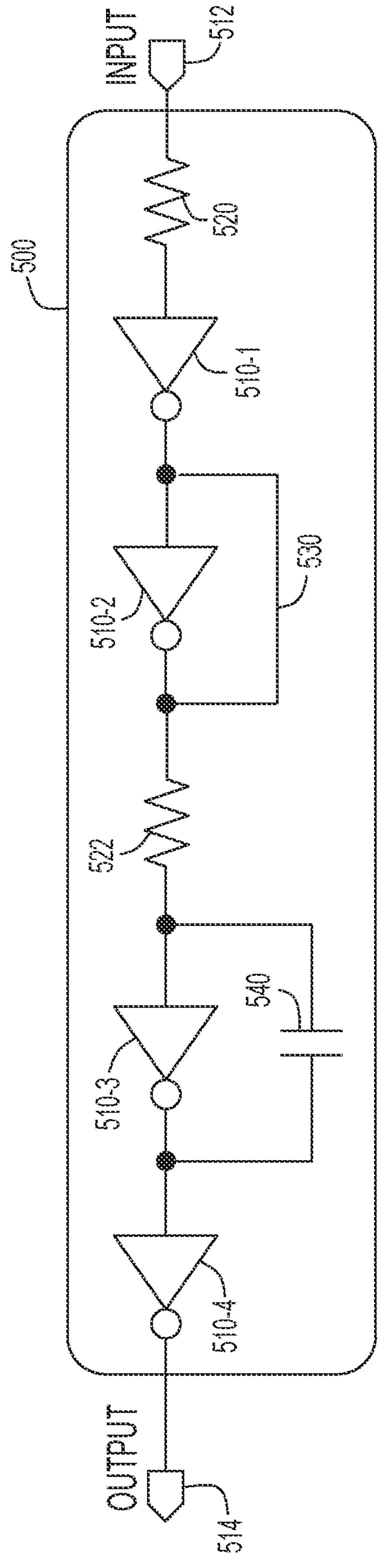
FIG. 5 is a circuit diagram of a DC cancellation feedback circuit that may be used for the DC cancellation feedback of FIG. 4, according to an example embodiment.

FIG. 5 shows an example schematic diagram of a DC cancellation feedback circuit 500 that may be used for DC cancellation feedback circuits 410, 415, 420, and 430 in FIG. 4. DC cancellation feedback circuit 500 includes a plurality of amplifiers 510-1, 510-2, 510-3 and 510-4 coupled between an input 512 and an output 514. There is a resister 520 connected between input 512 and amplifier 510-1, and a resistor 522 connected between amplifiers 510-2 and 510-3. In addition, there is a direct feedback connection 530 between the output and input of amplifier 510-2, and a capacitor 540 connected in a feedback path between the output and input of amplifier 510-3.

In operation, the cascade of amplifiers (gain stages) 510-1 to 510-4 results in a high DC gain from input 512 to output 514. The high gain minimizes any residual DC offset in the loop. The miller multiplication capacitor 540 combined with resistor 522 creates a low (~ tens of kilo hertz) pole so that the transfer function from the photodetector to output will have a high-pass response with a low corner frequency. This allows substantially all signal frequencies to pass to the output of differential TIA 110, minimizing the impact of low frequency ISI (i.e., baseline wander).

Figure 6:
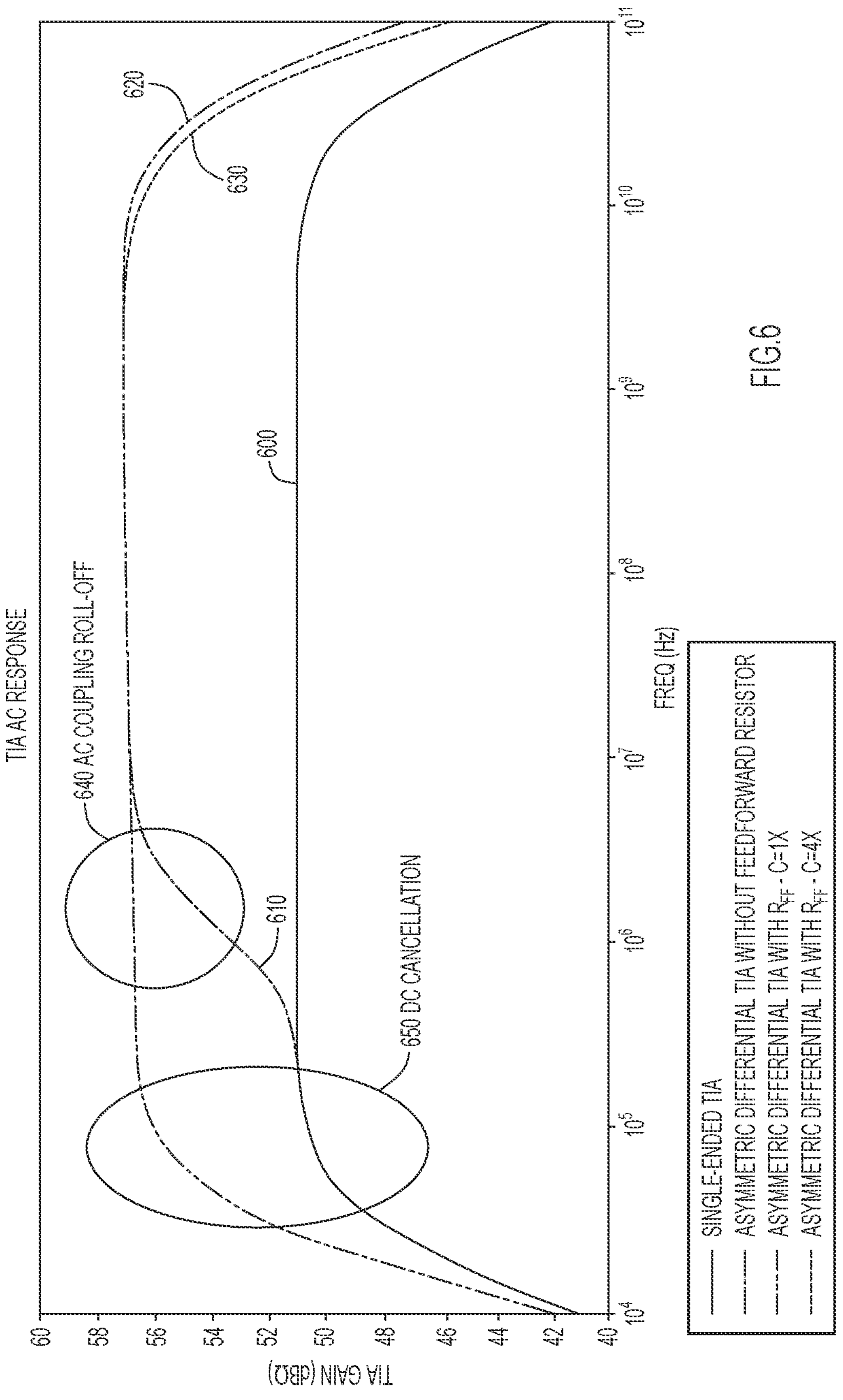
FIG. 6 is a comparison plot of AC frequency response curves for a single-ended TIA, an asymmetric differential TIA circuit that does not include a feedforward resistor, and the asymmetric differential TIA of FIG. 1 or FIG. 4 that includes the feedforward resistor, according to an example embodiment.

FIG. 6 is a comparison plot of example AC frequency response curves for a single-ended TIA (curve 600), an asymmetric differential TIA circuit that does not include a feedforward resistor (curve 610), an asymmetric differential TIA that includes a feedforward resistor (e.g., apparatus 100 or apparatus 400) (curves 620 and 630). Curves 620 and 630 are for different combinations of capacitance C and resistance $R_{FF}$ of AC coupling capacitor 140(1) and feedforward resistor 141(1) used in the asymmetric differential TIA circuit with the feedforward resistor. Compared to curves 600 and 610, curves 620 and 630 show substantially reduced low-frequency rolloff in region 640 and therefore increased bandwidth of the AC frequency response due to the presence of feedforward resistor 141(1) with AC coupling capacitor 140(1). This is because the feedforward resistor provides a low-impedance parallel resistive path for PD current 128 around the AC coupling capacitor at low- to mid-range frequencies of the PD current, which reduces the low-frequency rolloff frequency of the AC frequency response compared to when the first feedforward resistor is absent. The effect of DC cancellation is shown at region 650.

Figure 7:
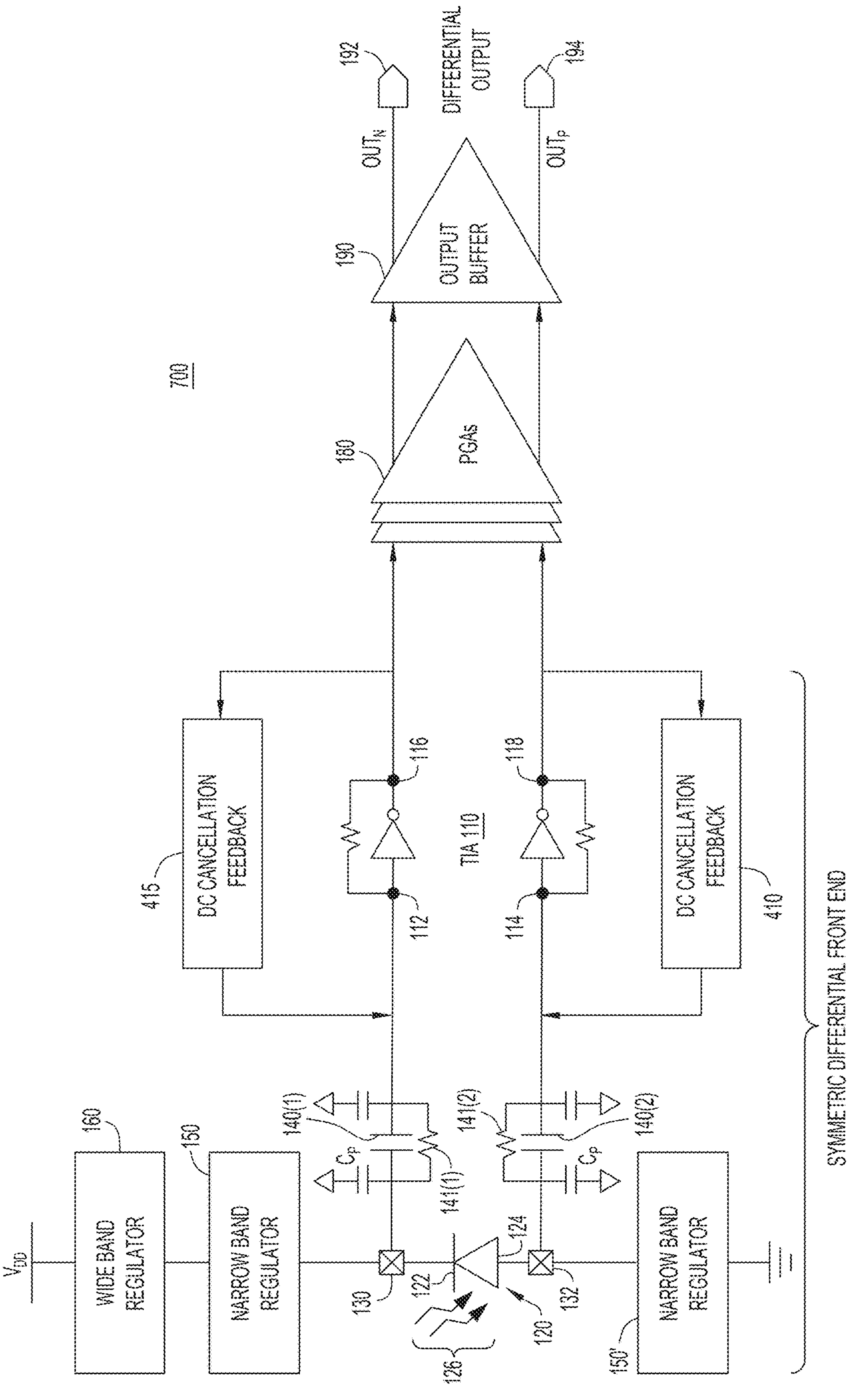
FIG. 7 is a circuit diagram of a symmetric differential TIA circuit with two parallel resistive feedforward AC coupling paths, according to an example embodiment.

FIG. 7 is a circuit diagram of an example symmetric differential TIA circuit 700 with two parallel resistive feedforward AC coupling paths and DC cancellation. Symmetric differential TIA circuit 700 may also be referred to as apparatus 700. Apparatus 700 is similar to apparatus 100 and apparatus 400, except for differences described below. Differential TIA 110 of apparatus 700 (and each of the TIAs employed in the circuits of FIGS. 9 and 10, described below) takes the form of a pseudo-differential amplifier (as depicted in the figures) by way of example only, but may be implemented alternatively in a fully differential form, or in any other known or hereafter developed form.

To provide symmetric input paths, apparatus 700 additionally includes AC coupling capacitor 140(2) and feedforward resistor 141(2) having respective first ends connected to second input 132 (i.e., anode 124) and respective second ends connected to second amplifier input 114. Thus, anode 124 is connected to second amplifier input 114 through a parallel circuit combination of AC coupling capacitor 140(2) and feedforward resistor 141(2).

In addition, apparatus 700 includes a second narrow band regulator 150', connected to and between second input 132 and ground, which replaces current source 402 of apparatus 400. Second narrow band regulator 150' is configured similarly to narrow band regulator 150. Another difference is that DC cancellation feedback circuit 410 is coupled between one of the outputs of differential TIA 110, and second amplifier input 114, instead of to current source 402. Thus, DC cancellation feedback circuit 410 provides a DC current cancelling control to second amplifier input 114 to control removal of DC current from the anode of PD 120.

Components 112-160 and 410-415 of apparatus 700 are collectively referred to as a symmetric differential front-end. The symmetric differential front-end converts PD current 128 generated at first input 130 (i.e., cathode 122) and second input 132 (i.e., anode 124) to the differential output voltage across first output 116 and second output 118.

Figure 8A:
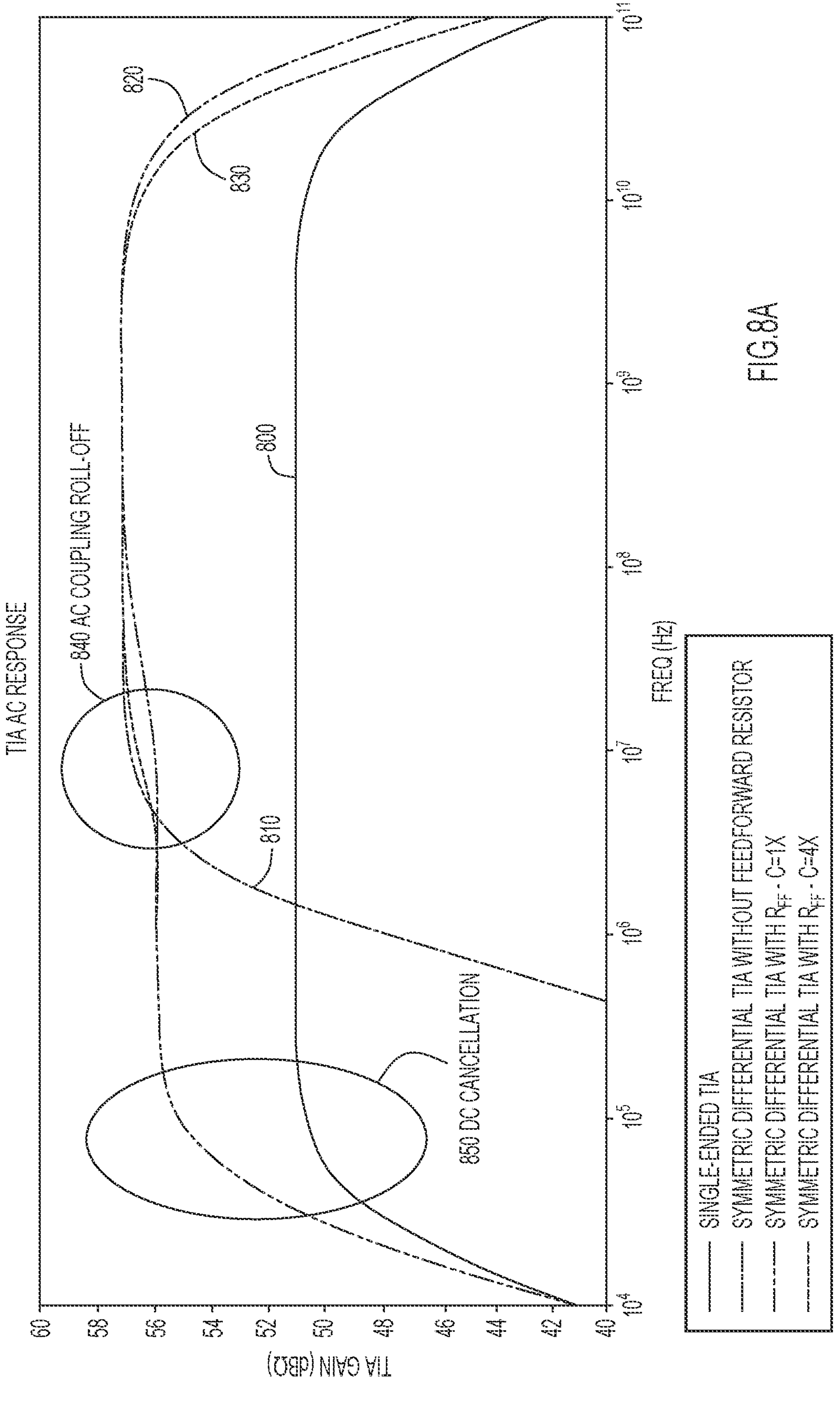
FIG. 8A is comparison plot of AC frequency response curves for a single-ended TIA, a symmetric differential TIA circuit that does not include feedforward resistors, and the symmetric differential TIA circuit of FIG. 7 that includes the feedforward resistors, according to an example embodiment.

FIG. 8A is comparison plot of example AC frequency response curves for a single-ended TIA (curve 800), a symmetric differential TIA circuit that does not include feedforward resistors (curve 810), and a symmetric differential TIA that includes feedforward resistors (e.g., apparatus 700) (curves 820 and 830). Curves 820 and 830 are for different combinations of capacitance C and resistance $R_{FF}$ of the AC coupling capacitors and the feedforward resistors. Compared to curves 800 and 810, curves 820 and 830 show substantially reduced low-frequency rolloff in region 840 and therefore increased bandwidth due to the presence of the feedforward resistors in parallel combination with the AC coupling capacitors. The effect of DC cancellation is shown at region 850.

Figure 8B:
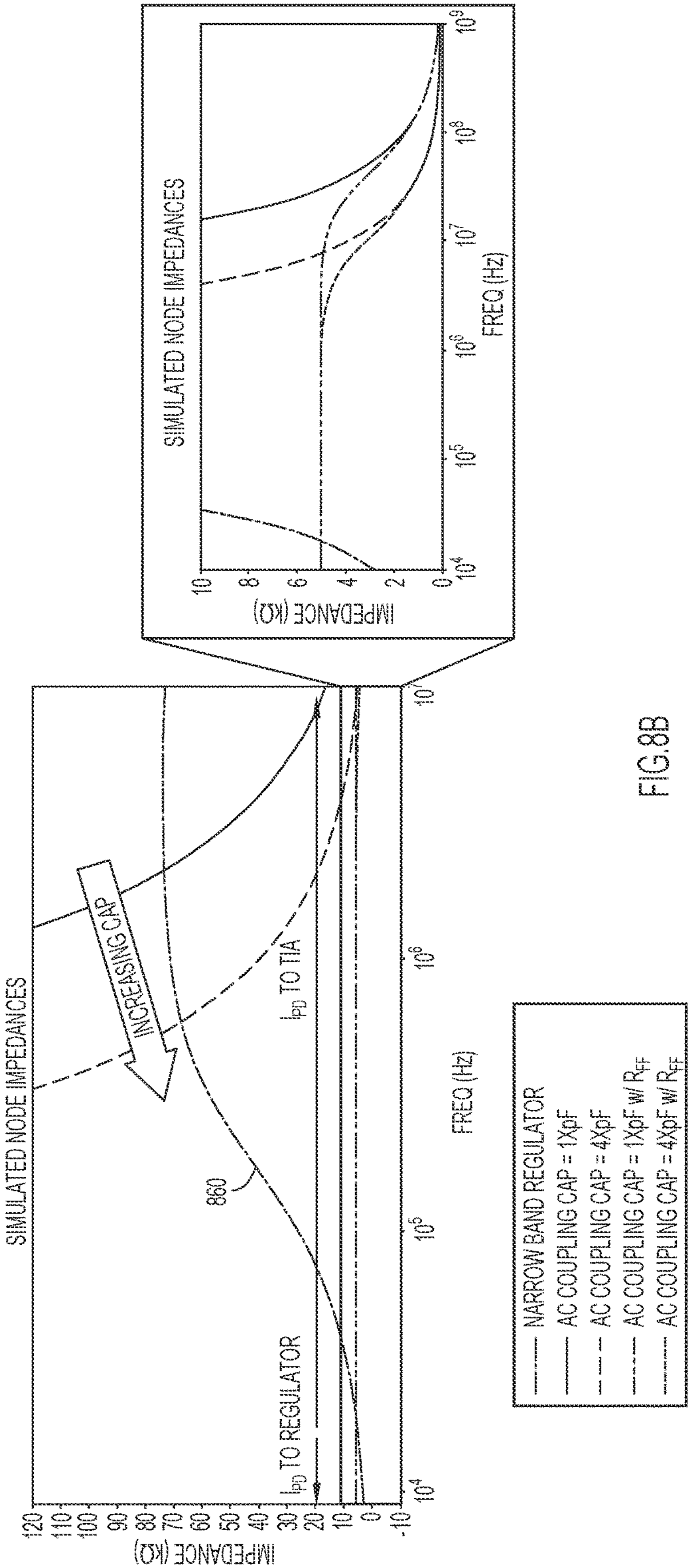
FIG. 8B is a plot of impedance vs. frequency at the cathode of a photodetector.

FIG. 8B is a plot of example cathode node (i.e., first input) impedance vs. frequency in apparatus 100, 400, or 700. Ideally, substantially all of PD current $I_{PD}$ at the cathode flows into the differential TIA (as shown at arrow "$I_{PD}$ to TIA") across a wide range of frequencies (from DC to high-range frequencies) rather than into narrow band regulator 150 or 150' (shown at arrow "$I_{PD}$ to Regulator"). To this end, the feedforward resistor provides a low impedance path for PD current $I_{PD}$ into the differential TIA at low- to mid-range frequencies, which advantageously decreases the frequency at which PD current $I_{PD}$ flows into the differential TIA to around 18 kHz, compared to a higher frequency where this would occur without the feedforward resistor. Curve 860 shows the impedance of narrow band regulator 150 or 150' across frequency. The presence of the feedforward resistor maintains a low impedance in the AC coupling path for the mid-band range of frequencies 30 kHz-1 MHz, so that PD current $I_{PD}$ flows into the differential TIA instead of into narrow band regulator 150 or 150', even when the impedance of the narrow band regulator is relatively low. Beyond 1 MHz impedance of AC coupling capacitor dominates effective input impedance to the differential TIA.

Figure 8C:
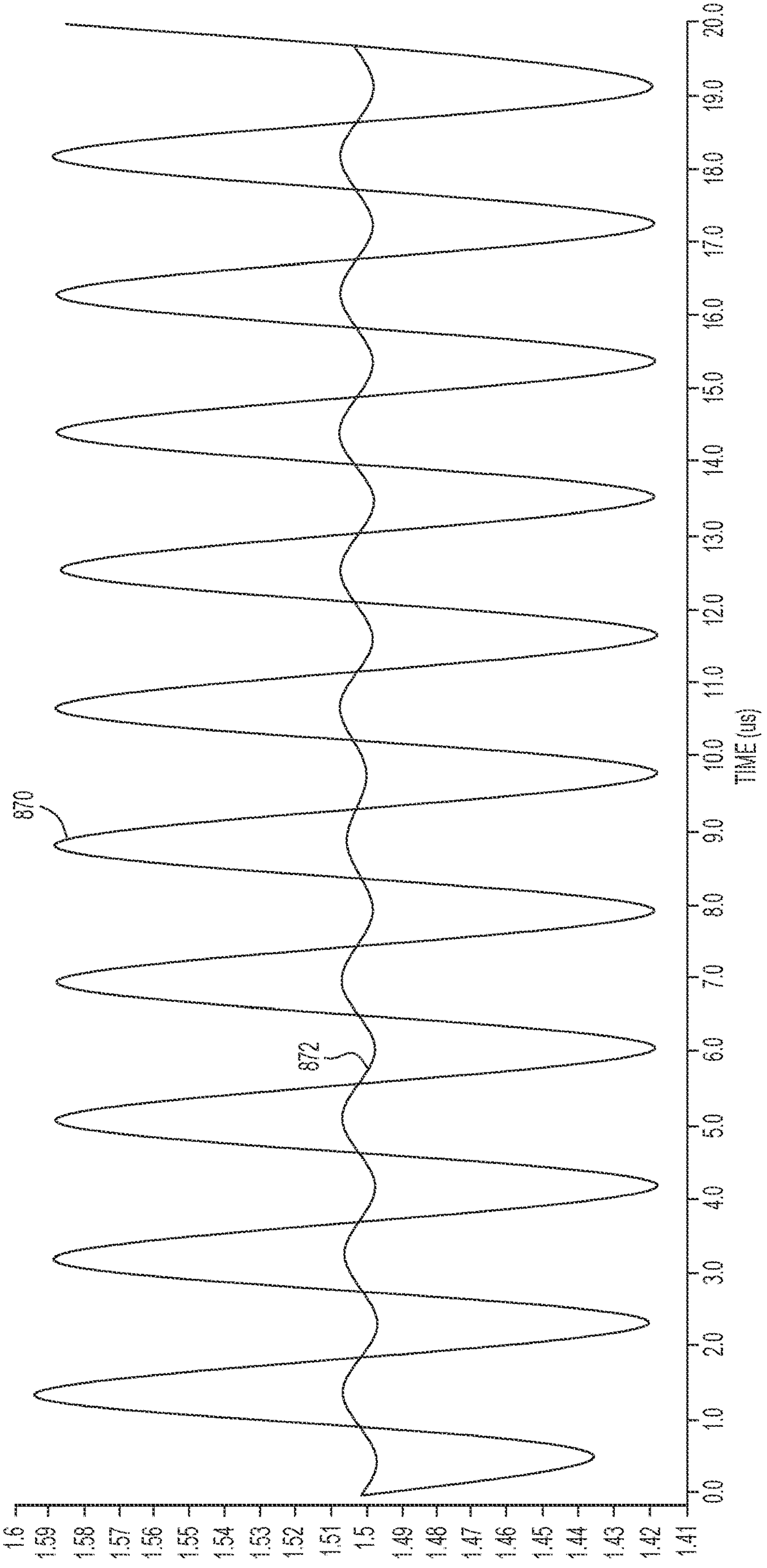
FIG. 8C is a comparison plot that shows a low-frequency AC voltage at the cathode without a feedforward resistor, and a low-frequency AC voltage at the cathode when the feedforward resistor is present.

FIG. 8C is an example comparison plot that shows a low-frequency AC voltage 870 at the cathode of PD 120 without the feedforward resistor, and a low-frequency AC voltage 872 at the cathode when the feedforward resistor is present. Low-frequency AC voltage 870 has a large voltage swing or amplitude due to a large net low-frequency impedance of narrow band regulator 150 and the AC coupling capacitor, without the feedforward resistance. The large voltage swing disadvantageously drives narrow band regulator 150 into a non-linear operating range, which impairs its performance. On the other hand, low-frequency AC voltage 872 has a significantly reduced voltage swing due to a significantly reduced low-frequency impedance presented by the feedforward resistor compared to that presented by the AC coupling capacitor and narrow band regulator 150. The reduced voltage swing maintains narrow band regulator 150 in the linear operating range of the narrow band regulator for better performance.

Figure 9:
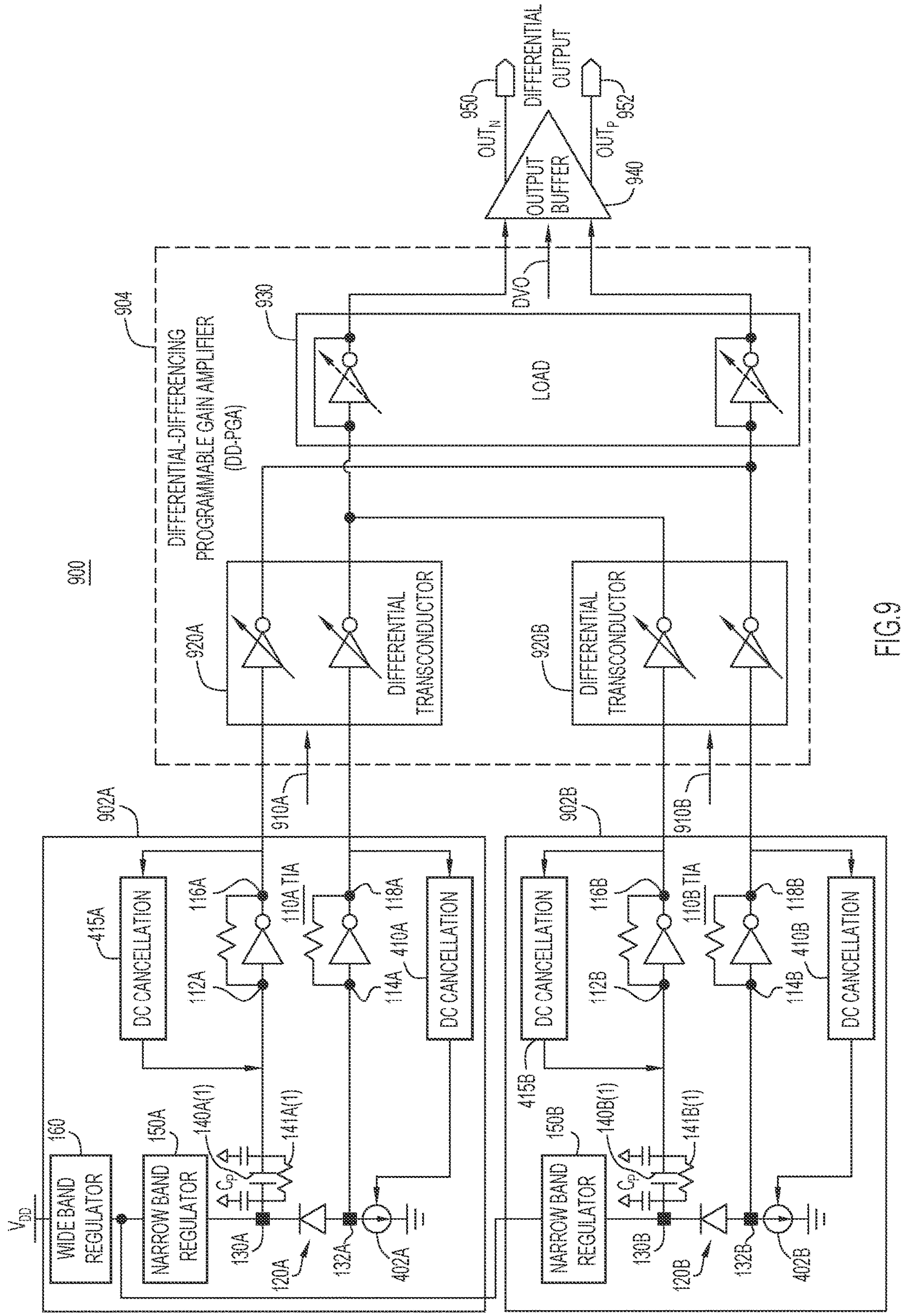
FIG. 9 is a circuit diagram of an asymmetric differential-differencing TIA circuit that includes asymmetric resistive feedforward AC coupling paths, according to an example embodiment.
Figure 10:
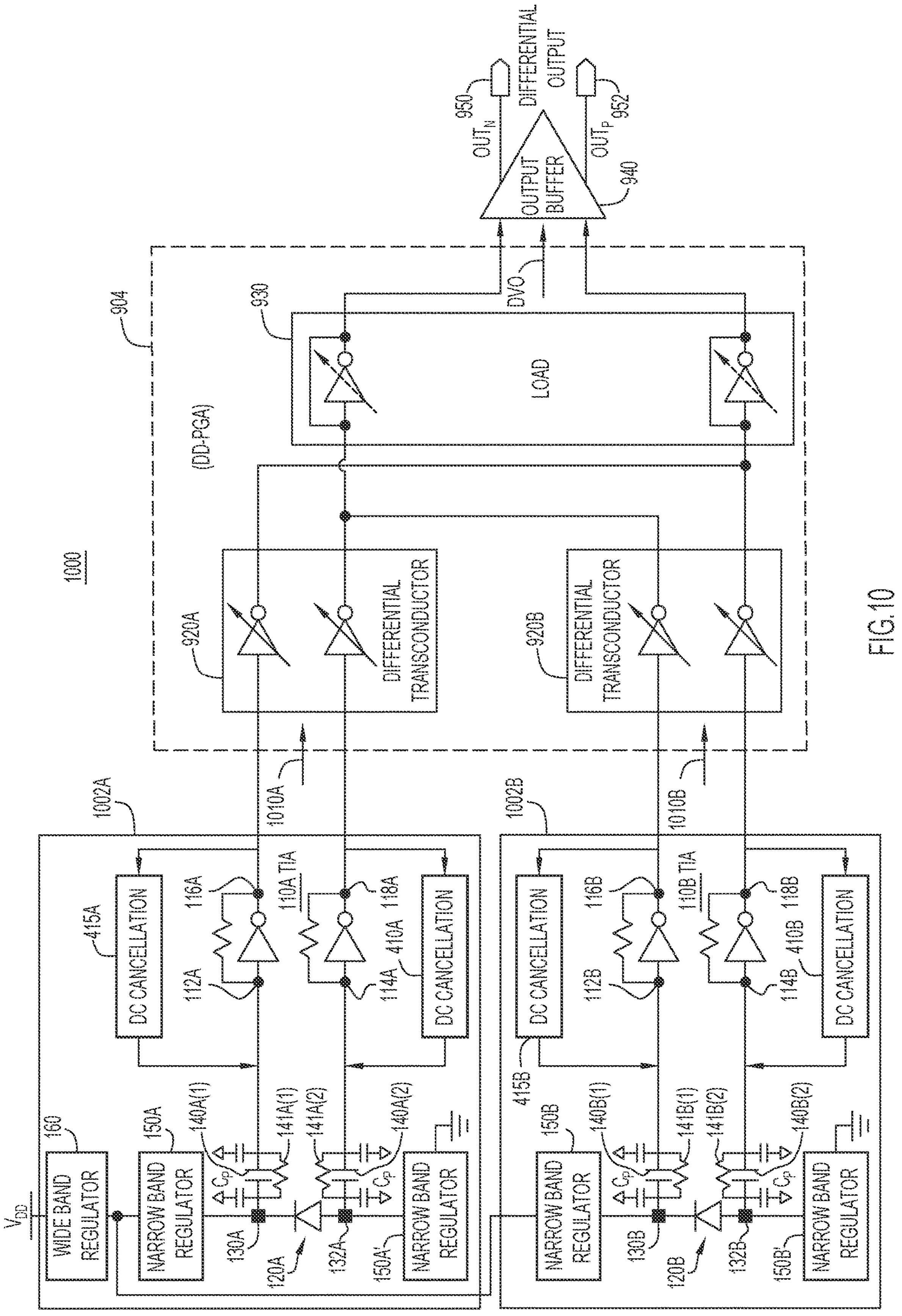
FIG. 10 is a circuit diagram of a symmetric differential-differencing TIA circuit that includes symmetric resistive feedforward AC coupling paths, according to an example embodiment.

FIG. 9 is a circuit diagram of an example asymmetric differential-differencing TIA circuit 900 that includes asymmetric resistive feedforward AC coupling paths. Asymmetric differential-differencing TIA circuit 900 may be referred to as apparatus 900. Apparatus 900 may be employed in amplification systems that employ coherent detection schemes. Apparatus 900 includes a first asymmetric differential front-end 902A, a second asymmetric differential front-end 902B, and a differential-differencing programmable gain amplifier (DD-PGA) 904. Asymmetric differential front-ends 902A, 902B are each configured similarly to the asymmetric differential front-end described above in connection with apparatus 400 of FIG. 4. Components of asymmetric differential front-ends 902A, 902B are designated in FIG. 9 with the same reference numerals as like components of the asymmetric differential front-end of apparatus 400 of FIG. 4, but modified to include suffixes A, B, respectively. For example, (i) asymmetric differential front-end 902A includes current source 402A, DC cancellation feedback circuit 410A, and DC cancellation feedback circuit 415A, and (ii) asymmetric differential front-end 902B includes current source 402B, DC cancellation feedback circuit 410B, and DC cancellation feedback circuit 415B.

In the example of FIG. 9, asymmetric differential front-ends 902A, 902B have respective narrow band regulators 150A, 150B, but share wide band regulator 160, which can be considered common to both of the asymmetric differential front-ends. In another example, each asymmetric differential front-end may have its own wide band regulator.

In first asymmetric differential front-end 902A, responsive to a first optical signal, first PD 120A generates a first (differential) PD current at first and second inputs 130A, 132A (i.e., at the cathode and anode of the first PD 120A, respectively). First input 130A (i.e., the cathode of first PD 120A) delivers first PD current to first amplifier input 112A through a first path that includes AC coupling capacitor 140A(1) and feedforward resistor 141A(1) connected in parallel with each other between the first input and the first amplifier input, as described above. Second input 132A (i.e., the anode of first PD 120A) delivers the first PD current over a second path, i.e., directly to second amplifier input 114A. Differential TIA 110A converts the first PD current delivered to first and second amplifier inputs 112A, 114A to a first differential output voltage 910A at outputs 116A, 118A.

Similarly, in second asymmetric differential front-end 902B, responsive to a second optical signal, second PD 120B generates a second (differential) PD current at first and second inputs 130B, 132B. First input 130B delivers the second PD current to first amplifier input 112B through AC coupling capacitor 140B(1) and feedforward resistor 141B(1) connected in parallel with each other between the first input and the first amplifier input, as described above. Second input 132B delivers the second PD current directly to second amplifier input 114B. Differential TIA 110B converts the second PD current as delivered to first and second amplifier inputs 112B, 114B to a second differential output voltage 910B at outputs 116B, 118B.

In an alternative arrangement of each of asymmetric differential front-ends 902A, 902B, the parallel combination of the AC coupling capacitor (e.g., 140A(1), 140B(1)) and the feedforward resistor (e.g., 141A(1), 141B(1)) may be switched to the alternative path, i.e., to and between the anode of the corresponding PD (e.g., 120A, 120B) and the second amplifier input of the corresponding differential TIA (e.g., 110A, 110B), as described above in connection with the alternative embodiments of the circuits of FIGS. 1 and 4.

In summary, asymmetric differential front-ends 902A, 902B produce differential output voltages 910A, 910B, respectively. The symmetric differential front-ends each respectively (and separately) includes:

1. A first input (130A or 130B) and a second input (132A or 132B) to be connected to a cathode and an anode of a photodetector (120A or 120B) configured to generate an output current.
2. A differential TIA (110A or 1101B) having (i) a first amplifier input (112A or 112B) coupled to the cathode through a first AC coupling capacitor (140A(1) or 140B(1)) and a first feedforward resistor (141A(1) or 141B(1)) connected in parallel with the first AC coupling capacitor, and (ii) a second amplifier input (114A or 114B) coupled to the anode at least indirectly. The differential TIA is configured to convert the output current of the photodetector (120A or 120B) as presented at the first and second amplifier inputs to a respective one of the first and second differential output voltages (910A or 910B).

Asymmetric differential front-ends 902A, 902B feed differential output voltages 910A, 910B to DD-PGA 904. DD-PGA 904 comprises adjustable differential transconductors 920A, 920B and an adjustable load 930 configured to perform a differencing operation on differential output voltages 910A, 910B to produce a combined differential differencing voltage DVO representative of the first and second PD currents/light signals, and to provide the same to an output buffer 940. Output buffer 940 buffers combined differential differencing voltage DVO, to produce a buffered differential output comprising (more generally) $OUT_N$, $OUT_P$ at respective output terminals 950, 952. As shown, adjustable differential transconductors 920A, 920B and adjustable load 930 may be inverter based.

FIG. 10 is a circuit diagram of an example symmetric differential-differencing TIA circuit 1000 that includes symmetric resistive feedforward AC coupling paths. Symmetric differential-differencing TIA circuit 1000 may be referred to as apparatus 1000. Apparatus 1000 may be employed in amplification systems that employ coherent detection schemes. Apparatus 1000 includes a first symmetric differential front-end 1002A, a second symmetric differential front-end 1002B, and DD-PGA 904. Symmetric differential front-ends 1002A, 1002B are each configured similarly to the symmetric differential front-end of apparatus 700 of FIG. 7. Components of symmetric differential front-ends 1002A, 1002B are designated with the same reference numerals as like components of the symmetric differential front-end of apparatus 700, but modified to include suffixes A, B, respectively. For example, narrow band regulator 150' of apparatus 700 of FIG. 7 is designated as narrow band regulator 150A' in first symmetric differential front-end 1002A of FIG. 10, and as narrow band regulator 150B' in first symmetric differential front-end 1002B of FIG. 10.

In first symmetric differential front-end 1002A, responsive to a first optical signal, first PD 120A generates a first PD current at first and second inputs 130A, 132A (i.e., at the cathode and the anode of PD 120A, respectively). First input 130A delivers the first PD current to first amplifier input 112A through AC coupling capacitor 140A(1) and feedforward resistor 141A(1) connected in parallel with each other between the first input and the first amplifier input, as described above. Similarly, second input 132A delivers the first PD current to second amplifier input 114A through AC coupling capacitor 140A(2) and feedforward resistor 141A (2) connected in parallel with each other between the second input and the second amplifier input. Differential TIA 110A converts the first PD current as delivered to first and second amplifier inputs 112A, 114A to a first differential output voltage 1010A at outputs 116A, 118B.

Similarly, in second symmetric differential front-end 1002B, responsive to a second optical signal, second PD 120B generates a second PD current at first and second inputs 130B, 132B. First input 130B delivers the second PD current to first amplifier input 112B through AC coupling capacitor 140B(1) and feedforward resistor 141B(1) connected in parallel with each other between the first input and the first amplifier input. Second input 132 delivers the second PD current to second amplifier input 114B through AC coupling capacitor 140B(2) and feedforward resistor 141B(2) connected in parallel with each other between the second input and the second amplifier input. Differential TIA 110B converts the second PD current delivered to first and second amplifier inputs 112B, 114B to a second differential output voltage 1010B at outputs 116B, 118B.

Symmetric differential front-ends 1002A, 1002B feed differential output voltages 1010A, 1010B to DD-PGA 904, which processes the two pairs of differential output voltages as described above in connection with FIG. 9.

Figure 11:
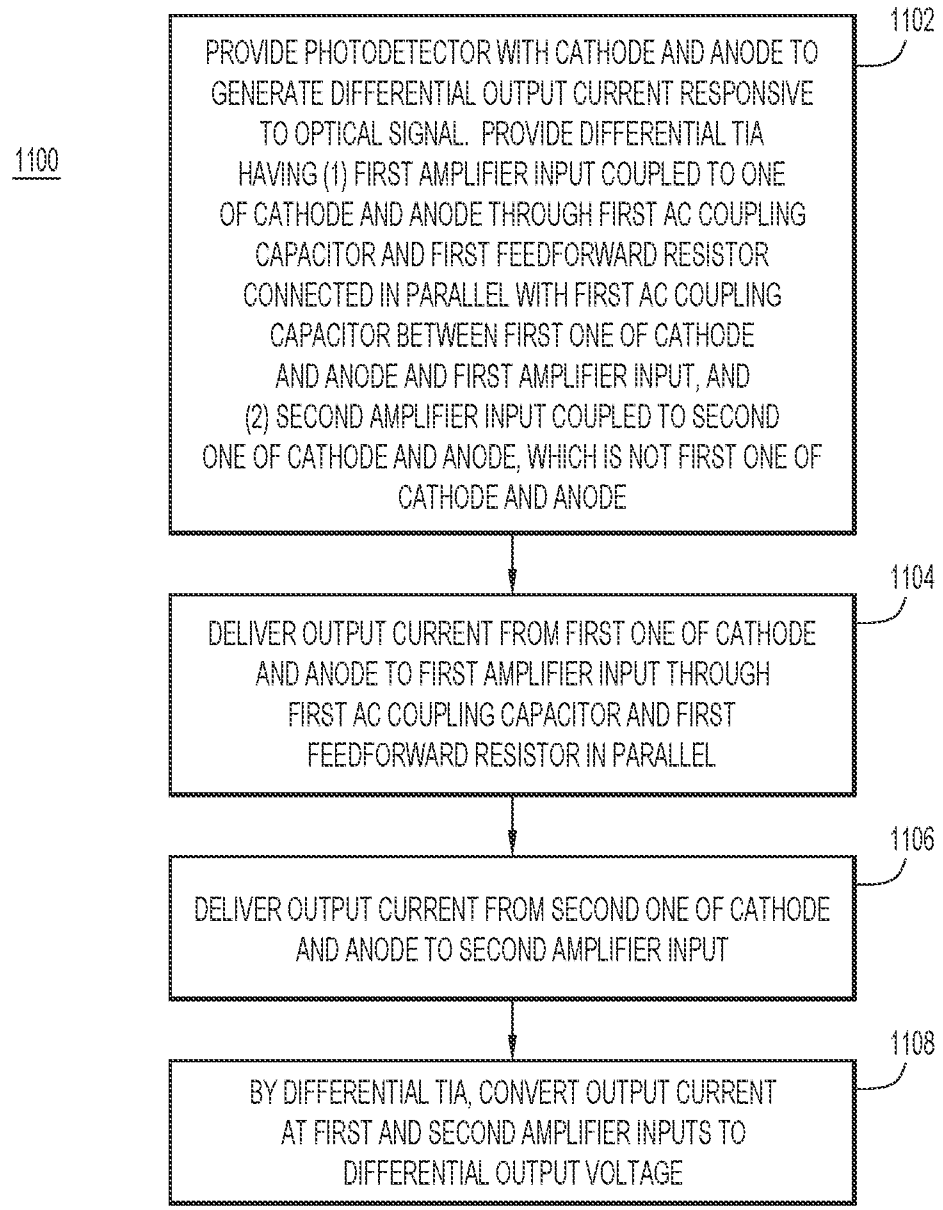
FIG. 11 is a flowchart of a method of amplifying an electrical current signal from a photodetector, according to an example embodiment.

FIG. 11 is a flowchart of an example method 1100 according to embodiments presented herein.

1102 includes providing a photodetector with a cathode and an anode configured to generate a differential output (i.e., electrical current) responsive to an optical signal. 1102 further includes providing a differential TIA having (i) a first amplifier input coupled to one of the cathode and the anode through a first AC coupling capacitor and a first feedforward resistor that is connected in parallel with the first AC coupling capacitor between the first one of the cathode and the anode and the first amplifier input, and (ii) a second amplifier input coupled to a second one of the cathode and the anode, which is not the first one of the cathode and the anode, at least indirectly.

1104 includes first delivering the output current from the first one of the cathode and the anode to the first amplifier input through the first AC coupling capacitor and the first feedforward resistor in parallel.

1106 includes second delivering the output current from the second one of the cathode and the anode to the second amplifier input.

1108 includes, by the differential TIA, converting the output current as presented at/delivered to the first amplifier input and the second amplifier input to a differential output voltage.

In a symmetric configuration, when the TIA has the second amplifier input connected to the second one of the cathode and the anode through a second AC coupling capacitor and a second feedforward resistor that is connected in parallel with the second AC coupling capacitor between the second one of the cathode and the anode and the second amplifier input, the second delivering operation 1106 includes delivering the output current from the second one of the cathode and the anode to the second amplifier input through the second AC coupling capacitor and the second feedforward resistor in parallel.

Figure 12:
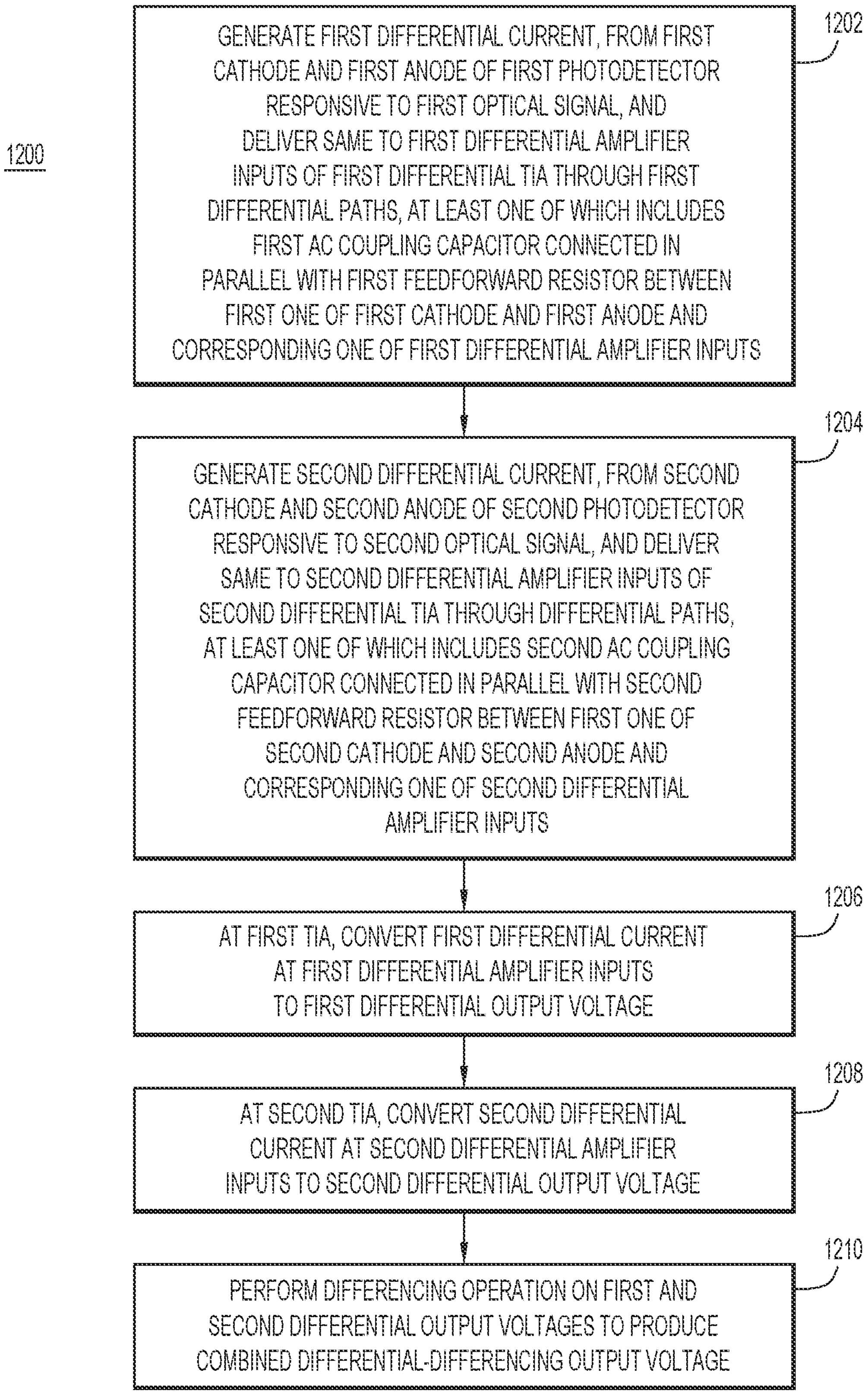
FIG. 12 is a flowchart of another method of amplifying an electrical current signal from photodetectors, according to an example embodiment.

FIG. 12 is a flowchart of an example method 1200 of amplifying an electrical current signal from photodetectors, according to embodiments presented herein.

1202 includes generating a first differential current, from a first cathode and a first anode (collectively referred to as "first differential outputs") of a first photodetector responsive to a first optical signal, and delivering the first differential current to first differential amplifier inputs of a first differential TIA through first differential paths, at least one of which includes a first AC coupling capacitor connected in parallel with a first feedforward resistor between a first one of the first cathode and the first anode and a corresponding one of the first differential amplifier inputs.

1204 includes generating a second differential current, from a second cathode and a second anode (collectively referred to as "second differential outputs") of a second photodetector responsive to a second optical signal, and delivering the second differential current to second differential amplifier inputs of a second differential TIA through differential paths, at least one of which includes a second AC coupling capacitor connected in parallel with a second feedforward resistor between a first one of the second cathode and the second anode and a corresponding one of the second differential amplifier inputs.

1206 includes, at the first differential TIA, converting the first differential current as presented at the first differential amplifier inputs by the first paths to a first differential output voltage.

1208 includes, at the second differential TIA, converting the second differential current as presented at the second differential amplifier inputs by the second paths to a second differential output voltage.

1210 includes performing a differencing operation on the first differential output voltage and the second differential output voltage to produce a combined differential-differencing output voltage that is representative of the first optical signal and the second optical signal.

An embodiment presented herein provides an asymmetric differential TIA structure/circuit with AC coupling on a cathode input, and a parallel resistive path around the capacitor that reduces a high pass pole in the frequency response and reduces baseline wander (ISI), all while having a minimal effect on integrated noise and high frequency bandwidth of the structure.

Another embodiment provides a symmetric differential TIA structure with AC coupling on both cathode and anode inputs, and a parallel resistive path around the capacitors that reduces the high pass pole and baseline wander, while having a minimal effect on integrated noise and a high frequency bandwidth.

Yet another embodiment provides an asymmetric differential-differencing TIA structure with AC coupling on the cathode input, and a parallel resistive path around the capacitor that reduces the high pass pole and baseline wander while having a minimal effect on integrated noise and high frequency bandwidth.

Another embodiment provides a symmetric differential-differencing TIA structure with AC coupling on both cathode and anode inputs, and a parallel resistive path around the capacitors that reduces the high pass pole and baseline wander while having a minimal effect on integrated noise and high frequency bandwidth.

Figure 13:
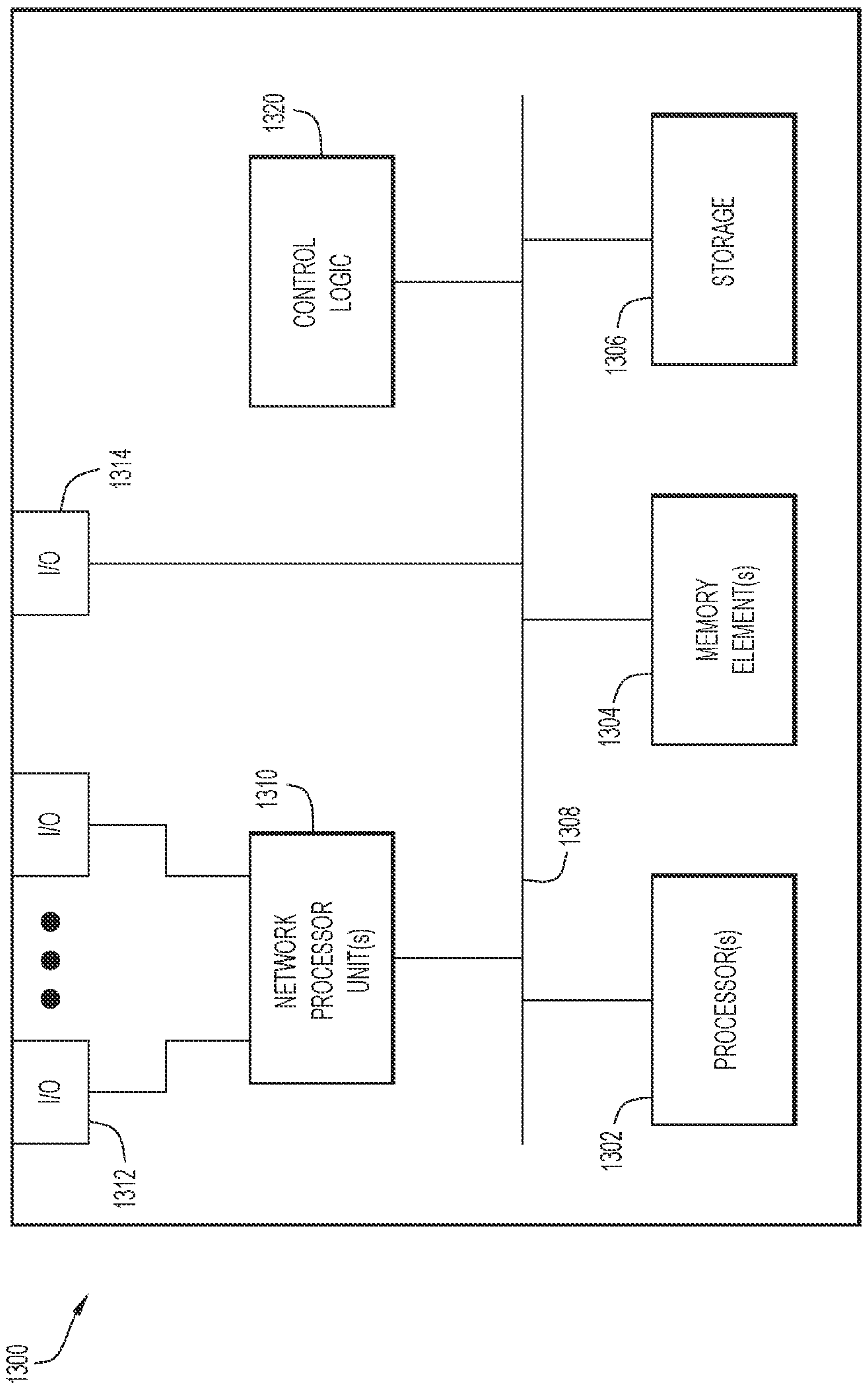
FIG. 13 illustrates a hardware block diagram of a computing device that may perform functions associated with operations discussed herein in connection with the techniques presented herein, according to an example embodiment.

Referring to FIG. 13, FIG. 13 illustrates a hardware block diagram of a computing device 1300 that may perform functions associated with operations discussed herein in connection with techniques depicted in FIGS. 1-12. In various embodiments, a computing device or apparatus, such as computing device 1300 or any combination of computing devices 1300, may be configured as any entity/entities as discussed for techniques depicted in connection with FIGS. 1-12 in order to perform operations of various techniques discussed herein. For example, computing device 1300 may be configured to include an optical receiver that includes apparatus 100, 400, 700, 900, or 1000.

In at least one embodiment, the computing device 1300 may be any apparatus that may include one or more processor(s) 1302, one or more memory element(s) 1304, storage 1306, a bus 1308, one or more network processor unit(s) 1310 interconnected with one or more network input/output (I/O) interface(s) 1312, one or more I/O interface(s) 1314, and control logic 1320. In various embodiments, instructions associated with logic for computing device 1300 can overlap in any manner and are not limited to the specific allocation of instructions and/or operations described herein.

In at least one embodiment, processor(s) 1302 is/are at least one hardware processor configured to execute various tasks, operations and/or functions for computing device 1300 as described herein according to software and/or instructions configured for computing device 1300. Processor(s) 1302 (e.g., a hardware processor) can execute any type of instructions associated with data to achieve the operations detailed herein. In one example, processor(s) 1302 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 1304 and/or storage 1306 is/are configured to store data, information, software, and/or instructions associated with computing device 1300, and/or logic configured for memory element(s) 1304 and/or storage 1306. For example, any logic described herein (e.g., control logic 1320) can, in various embodiments, be stored for computing device 1300 using any combination of memory element(s) 1304 and/or storage 1306. Note that in some embodiments, storage 1306 can be consolidated with memory element(s) 1304 (or vice versa), or can overlap/exist in any other suitable manner.

In at least one embodiment, bus 1308 can be configured as an interface that enables one or more elements of computing device 1300 to communicate in order to exchange information and/or data. Bus 1308 can be implemented with any architecture designed for passing control, data and/or information between processors, memory elements/storage, peripheral devices, and/or any other hardware and/or software components that may be configured for computing device 1300. In at least one embodiment, bus 1308 may be implemented as a fast kernel-hosted interconnect, potentially using shared memory between processes (e.g., logic), which can enable efficient communication paths between the processes.

In various embodiments, network processor unit(s) 1310 may enable communication between computing device 1300 and other systems, entities, etc., via network I/O interface(s) 1312 (wired and/or wireless) to facilitate operations discussed for various embodiments described herein. In various embodiments, network processor unit(s) 1310 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 1300 and other systems, entities, etc. to facilitate operations for various embodiments described herein. In various embodiments, network I/O interface(s) 1312 can be configured as one or more Ethernet port(s), Fibre Channel ports, any other I/O port(s), and/or antenna(s)/antenna array(s) now known or hereafter developed. Thus, the network processor unit(s) 1310 and/or network I/O interface(s) 1312 may include suitable interfaces for receiving, transmitting, and/or otherwise communicating data and/or information in a network environment.

I/O interface(s) 1314 allow for input and output of data and/or information with other entities that may be connected to computing device 1300. For example, I/O interface(s) 1314 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 1320 can include instructions that, when executed, cause processor(s) 1302 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 1320) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, any entity or apparatus as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 1304 and/or storage 1306 can store data, software, code, instructions (e.g., processor instructions), logic, parameters, combinations thereof, and/or the like used for operations described herein. This includes memory element(s) 1304 and/or storage 1306 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™ mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

In various example implementations, any entity or apparatus for various embodiments described herein can encompass network elements (which can include virtualized network elements, functions, etc.) such as, for example, network appliances, forwarders, routers, servers, switches, gateways, bridges, loadbalancers, firewalls, processors, modules, radio receivers/transmitters, or any other suitable device, component, element, or object operable to exchange information that facilitates or otherwise helps to facilitate various operations in a network environment as described for various embodiments herein. Note that with the examples provided herein, interaction may be described in terms of one, two, three, or four entities. However, this has been done for purposes of clarity, simplicity and example only. The examples provided should not limit the scope or inhibit the broad teachings of systems, networks, etc. described herein as potentially applied to a myriad of other architectures.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

As used herein, the term "connected to" (and similarly "coupled to"), unless specified otherwise, covers both an arrangement in which components are directly connected to each other, and an arrangement in which the components are indirectly connected to each other through one or more intermediate components.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In summary, in some aspects, the techniques described herein relate to an apparatus including: a photodetector having a cathode and an anode to generate an output current; and a differential transimpedance amplifier (TIA) having a first amplifier input coupled to a first one of the cathode and the anode through a first AC coupling capacitor and a first feedforward resistor that is connected in parallel with the first AC coupling capacitor between the first one of the cathode and the anode and the first amplifier input, the differential TIA having a second amplifier input coupled to a second one of the cathode and the anode that is not the first one of the anode and the cathode, the differential TIA configured to convert the output current of the photodetector as presented at the first amplifier input and the second amplifier input to a differential output voltage.

In some aspects, the techniques described herein relate to an apparatus, wherein the first feedforward resistor is configured to provide a parallel resistive path around the first AC coupling capacitor to reduce a low-frequency rolloff frequency of the TIA compared to when the first feedforward resistor is absent.

In some aspects, the techniques described herein relate to an apparatus, further including: a narrow band regulator coupled to the first one of the cathode and the anode and having a frequency-dependent impedance that increases with frequency so as to cause more of the output current of the photodetector to flow into the differential TIA with increasing frequency of the output current of the photodetector.

In some aspects, the techniques described herein relate to an apparatus, further including: a wide band regulator coupled between the narrow band regulator and a voltage supply, wherein the wide band regulator is configured to suppress noise of the voltage supply over a wide range of frequencies.

In some aspects, the techniques described herein relate to an apparatus, wherein: the second amplifier input is connected to the second one of the cathode and the anode through a second AC coupling capacitor and a second feedforward resistor that is connected in parallel with the second AC coupling capacitor between the second one of the cathode and the anode and the second amplifier input.

In some aspects, the techniques described herein relate to an apparatus, wherein the differential TIA is configured to provide the differential output voltage across a first output and a second output of the differential TIA, and the apparatus further includes: a first DC cancellation feedback loop connected to the second output and to provide a first DC canceling control to the second amplifier input.

In some aspects, the techniques described herein relate to an apparatus, further including: a second DC cancellation feedback loop connected from the first output to the first amplifier input to provide a second DC canceling control to the first amplifier input.

In some aspects, the techniques described herein relate to an apparatus, further including: a differential programmable gain amplifier to amplify the differential output voltage to generate differential programmable gain outputs; and an output buffer to buffer the differential programmable gain outputs to provide a buffered differential output voltage at first and second differential outputs.

In some aspects, the techniques described herein relate to an apparatus, further including: a DC cancellation feedback circuit connected between one of the first and second differential outputs of the output buffer and the differential programmable gain amplifier to provide a DC cancellation control to the differential programmable gain amplifier.

In some aspects, the techniques described herein relate to an apparatus including: first and second differential front-ends to produce first and second differential output voltages, respectively, wherein the first and second differential front-ends each respectively includes: a photodetector having a cathode and an anode to generate an output current; and a differential transimpedance amplifier (TIA) having a first amplifier input coupled to a first one of the cathode and the anode through a first AC coupling capacitor and a first feedforward resistor connected in parallel with the first AC coupling capacitor, the differential TIA having a second amplifier input coupled to a second one of the cathode and the anode that is not the first one of the cathode and the anode, the differential TIA configured to convert the output current of the photodetector as presented at the first amplifier input and the second amplifier input to a respective one of the first and second differential output voltages; and a differential-differencing programmable gain amplifier to perform a differencing operation on the first and second differential output voltages to produce a combined differential-differencing voltage.

In some aspects, the techniques described herein relate to an apparatus, wherein the first feedforward resistor is configured to provide a parallel resistive path around the first AC coupling capacitor to reduce a low-frequency rolloff frequency of the differential TIA compared to when the first feedforward resistor is absent.

In some aspects, the techniques described herein relate to an apparatus, wherein the first and second differential front-ends each respectively further includes: a narrow band regulator coupled to the first one of the cathode and the anode and having a frequency dependent impedance that increases with frequency so as to cause more of the output current of the photodetector to flow into the differential TIA with increasing frequency of the output current of the photodetector.

In some aspects, the techniques described herein relate to an apparatus, wherein the first and second differential front-ends each respectively further includes: a wide band regulator coupled between the narrow band regulator and a voltage supply, wherein the wide band regulator is configured to suppress noise of the voltage supply over a wide range of frequencies.

In some aspects, the techniques described herein relate to an apparatus, wherein: the second amplifier input is connected to the second one of the cathode and the anode through a second AC coupling capacitor and a second feedforward resistor that is connected in parallel with the second AC coupling capacitor between the second one of the cathode and the anode and the second amplifier input.

In some aspects, the techniques described herein relate to an apparatus, wherein the differential TIA is configured to provide the respective one of the first and second differential output voltages across a first output and a second output of the differential TIA, and the first and second differential TIA front-ends each respectively further includes: a first DC cancellation feedback loop connected to the second output and to provide a first DC canceling control to the second amplifier input.

In some aspects, the techniques described herein relate to an apparatus, wherein the first and second differential front-ends each respectively further includes: a second DC cancellation feedback loop connected from the first output to the first amplifier input to provide a second DC canceling control to the first amplifier input.

In some aspects, the techniques described herein relate to an apparatus, further including: an output buffer to buffer the combined differential-differencing voltage to provide a buffered combined differential-differencing voltage.

In some aspects, the techniques described herein relate to a method including: providing a photodetector having an anode and a cathode to generate an output current; providing a differential transimpedance amplifier (TIA) having a first amplifier input coupled to a first one of the cathode and the anode through a first AC coupling capacitor and a first feedforward resistor that is connected in parallel with the first AC coupling capacitor between the first one of the cathode and the anode and the first amplifier input, the differential TIA having a second amplifier input coupled to a second one of the cathode and the anode that is not the first one of the cathode and the anode; first delivering the output current from the first one of the cathode and the anode to the first amplifier input through the first AC coupling capacitor and the first feedforward resistor in parallel; second delivering the output current from the second one of the cathode and the anode to the second amplifier input; and by the differential TIA, converting the output current as presented at the first amplifier input and the second amplifier input to a differential output voltage.

In some aspects, the techniques described herein relate to a method, wherein the first feedforward resistor provides a parallel resistive path around the first AC coupling capacitor to reduce a low-frequency rolloff frequency of the TIA compared to when the first feedforward resistor is absent.

In some aspects, the techniques described herein relate to a method, wherein: providing includes providing the differential TIA to have the second amplifier input connected to the second one of the cathode and the anode through a second AC coupling capacitor and a second feedforward resistor that is connected in parallel with the second AC coupling capacitor between the second one of the cathode and the anode and the second amplifier input; and second delivering includes delivering the output current from the second one of the cathode and the anode to the second amplifier input through the second AC coupling capacitor and the second feedforward resistor in parallel.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:

a photodetector having a cathode and an anode to generate an output current;

a differential transimpedance amplifier (TIA) having a first amplifier input coupled to a first one of the cathode and the anode through a first AC coupling capacitor and a first feedforward resistor that is connected in parallel with the first AC coupling capacitor between the first one of the cathode and the anode and the first amplifier input, the differential TIA having a second amplifier input coupled to a second one of the cathode and the anode that is not the first one of the anode and the cathode, the differential TIA configured to convert the output current of the photodetector as presented at the first amplifier input and the second amplifier input to a differential output voltage;

a narrow band regulator coupled to the first one of the cathode and the anode and having a frequency-dependent impedance that increases with frequency so as to cause more of the output current of the photodetector to flow into the differential TIA with increasing frequency of the output current of the photodetector; and a wide band regulator coupled between the narrow band regulator and a voltage supply in a cascaded fashion such that the wide band regulator precedes the narrow band regulator with respect to the voltage supply, wherein the wide band regulator is configured to suppress noise of the voltage supply over a wide range of frequencies.

2. The apparatus of claim 1, wherein the first feedforward resistor is configured to provide a parallel resistive path around the first AC coupling capacitor to reduce a low-frequency rolloff frequency of the TIA compared to when the first feedforward resistor is absent.

3. The apparatus of claim 1, wherein:

the narrow band regulator is configured so that the output current of the photodetector is presented with the frequency-dependent impedance looking into the narrow band regulator.

4. The apparatus of claim 1, wherein:

the wide band regulator is an operational amplifier based regulator.

5. The apparatus of claim 1, wherein:

the second amplifier input is connected to the second one of the cathode and the anode through a second AC coupling capacitor and a second feedforward resistor that is connected in parallel with the second AC coupling capacitor between the second one of the cathode and the anode and the second amplifier input.

6. The apparatus of claim 1, wherein the differential TIA is configured to provide the differential output voltage across a first output and a second output of the differential TIA, and the apparatus further comprises:

a first DC cancellation feedback loop connected to the second output and to provide a first DC canceling control to the second amplifier input.

7. The apparatus of claim 6, further comprising:

a second DC cancellation feedback loop connected from the first output to the first amplifier input to provide a second DC canceling control to the first amplifier input.

8. The apparatus of claim 1, further comprising:

a differential programmable gain amplifier to amplify the differential output voltage to generate differential programmable gain outputs; and an output buffer to buffer the differential programmable gain outputs to provide a buffered differential output voltage at first and second differential outputs.

9. The apparatus of claim 8, further comprising:

a DC cancellation feedback circuit connected between one of the first and second differential outputs of the output buffer and the differential programmable gain amplifier to provide a DC cancellation control to the differential programmable gain amplifier.

10. An apparatus comprising:

first and second differential front-ends to produce first and second differential output voltages, respectively, wherein the first and second differential front-ends each respectively includes:

a photodetector having a cathode and an anode to generate an output current; and a differential transimpedance amplifier (TIA) having a first amplifier input coupled to a first one of the cathode and the anode through a first AC coupling capacitor and a first feedforward resistor connected in parallel with the first AC coupling capacitor, the differential TIA having a second amplifier input coupled to a second one of the cathode and the anode that is not the first one of the cathode and the anode, the differential TIA configured to convert the output current of the photodetector as presented at the first amplifier input and the second amplifier input to a respective one of the first and second differential output voltages;

a differential-differencing programmable gain amplifier to perform a differencing operation on the first and second differential output voltages to produce a combined differential-differencing voltage;

a narrow band regulator coupled to the first one of the cathode and the anode and having a frequency-dependent impedance that increases with frequency so as to cause more of the output current of the photodetector to flow into the differential TIA with increasing frequency of the output current of the photodetector; and a wide band regulator coupled between the narrow band regulator and a voltage supply in a cascaded fashion such that the wide band regulator precedes the narrow band regulator with respect to the voltage supply, wherein the wide band regulator is configured to suppress noise of the voltage supply over a wide range of frequencies.

11. The apparatus of claim 10, wherein the first feedforward resistor is configured to provide a parallel resistive path around the first AC coupling capacitor to reduce a low-frequency rolloff frequency of the differential TIA compared to when the first feedforward resistor is absent.

12. The apparatus of claim 10, wherein:

the narrow band regulator is configured so that the output current of the photodetector is presented with the frequency-dependent impedance looking into the narrow band regulator.

13. The apparatus of claim 10, wherein:

the wide band regulator is an operational amplifier based regulator.

14. The apparatus of claim 10, wherein:

the second amplifier input is connected to the second one of the cathode and the anode through a second AC coupling capacitor and a second feedforward resistor that is connected in parallel with the second AC coupling capacitor between the second one of the cathode and the anode and the second amplifier input.

15. The apparatus of claim 10, wherein the differential TIA is configured to provide the respective one of the first and second differential output voltages across a first output and a second output of the differential TIA, and the first and second differential front-ends each respectively further includes:

a first DC cancellation feedback loop connected to the second output and to provide a first DC canceling control to the second amplifier input.

16. The apparatus of claim 15, wherein the first and second differential front-ends each respectively further includes:

a second DC cancellation feedback loop connected from the first output to the first amplifier input to provide a second DC canceling control to the first amplifier input.

17. The apparatus of claim 10, further comprising:

an output buffer to buffer the combined differential-differencing voltage to provide a buffered combined differential-differencing voltage.

18. A method comprising:

providing a photodetector having an anode and a cathode to generate an output current;

providing a differential transimpedance amplifier (TIA) having;

a first amplifier input coupled to a first one of the cathode and the anode through a first AC coupling capacitor and a first feedforward resistor that is connected in parallel with the first AC coupling capacitor between the first one of the cathode and the anode and the first amplifier input, the differential TIA having a second amplifier input coupled to a second one of the cathode and the anode that is not the first one of the cathode and the anode;

a narrow band regulator coupled to the first one of the cathode and the anode and having a frequency-dependent impedance that increases with frequency so as to cause more of the output current of the photodetector to flow into the differential TIA with increasing frequency of the output current of the photodetector; and a wide band regulator coupled between the narrow band regulator and a voltage supply in a cascaded fashion such that the wide band regulator precedes the narrow band regulator with respect to the voltage supply, wherein the wide band regulator is configured to suppress noise of the voltage supply over a wide range of frequencies;

first delivering the output current from the first one of the cathode and the anode to the first amplifier input through the first AC coupling capacitor and the first feedforward resistor in parallel;

second delivering the output current from the second one of the cathode and the anode to the second amplifier input; and by the differential TIA, converting the output current as presented at the first amplifier input and the second amplifier input to a differential output voltage.

19. The method of claim 18, wherein the first feedforward resistor provides a parallel resistive path around the first AC coupling capacitor to reduce a low-frequency rolloff frequency of the TIA compared to when the first feedforward resistor is absent.

20. The method of claim 18, wherein:

providing includes providing the differential TIA to have the second amplifier input connected to the second one of the cathode and the anode through a second AC coupling capacitor and a second feedforward resistor that is connected in parallel with the second AC coupling capacitor between the second one of the cathode and the anode and the second amplifier input; and second delivering includes delivering the output current from the second one of the cathode and the anode to the second amplifier input through the second AC coupling capacitor and the second feedforward resistor in parallel.

* * * * *